(12) United States Patent
Matsuzaki

(10) Patent No.: US 7,985,682 B2
(45) Date of Patent: Jul. 26, 2011

(54) METHOD OF FABRICATING SEMICONDUCTOR DEVICE

(75) Inventor: Kenji Matsuzaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 12/635,024

(22) Filed: Dec. 10, 2009

(65) Prior Publication Data

US 2010/0197107 A1 Aug. 5, 2010

(30) Foreign Application Priority Data

Feb. 3, 2009 (JP) .................................. 2009-022520

(51) Int. Cl.
*H01L 21/311* (2006.01)
*H01L 21/76* (2006.01)

(52) U.S. Cl. . 438/694; 438/689; 438/424; 257/E21.023; 257/E21.035; 257/E21.038

(58) Field of Classification Search .......... 438/424–438, 438/689–703
See application file for complete search history.

(56) References Cited

U.S. PATENT DOCUMENTS

| | | | | |
|---|---|---|---|---|
| 6,638,441 B2 * | 10/2003 | Chang et al. | | 216/46 |
| 6,967,140 B2 * | 11/2005 | Doyle | | 438/282 |
| 7,291,560 B2 | 11/2007 | Parascandola et al. | | |
| 7,659,208 B2 * | 2/2010 | Zhou et al. | | 438/700 |
| 2005/0215040 A1 * | 9/2005 | Doyle | | 438/585 |
| 2006/0240361 A1 * | 10/2006 | Lee et al. | | 430/313 |
| 2006/0273456 A1 * | 12/2006 | Sant et al. | | 257/734 |
| 2007/0049040 A1 * | 3/2007 | Bai et al. | | 438/712 |
| 2008/0057692 A1 * | 3/2008 | Wells et al. | | 438/597 |
| 2009/0032963 A1 * | 2/2009 | Tran | | 257/774 |
| 2009/0130851 A1 | 5/2009 | Hasegawa et al. | | |

FOREIGN PATENT DOCUMENTS

JP  2009-130035  6/2009

* cited by examiner

*Primary Examiner* — Michael S Lebentritt
*Assistant Examiner* — Karen M Kusumakar
(74) *Attorney, Agent, or Firm* — Oblon, Spivak, McClelland, Maier & Neustadt, L.L.P.

(57) ABSTRACT

A method of fabricating a semiconductor device includes forming a first film on a processed film, patterning the first film into a pattern with smaller width and a space with larger width, forming a second film along upper and side surfaces of first film and an upper surface of second film, etching the second film thereby to expose upper surfaces of first film and processed film while part of second film remains along the side surface of first film, etching the first film under the condition that the first film has higher etch selectivity than the second film, etching an upper part of second film under the condition that the second film has a higher etch selectivity than the processed film, after the first film has been etched, and etching the processed film with the second film serving as mask after the upper part of second film has been etched.

20 Claims, 29 Drawing Sheets

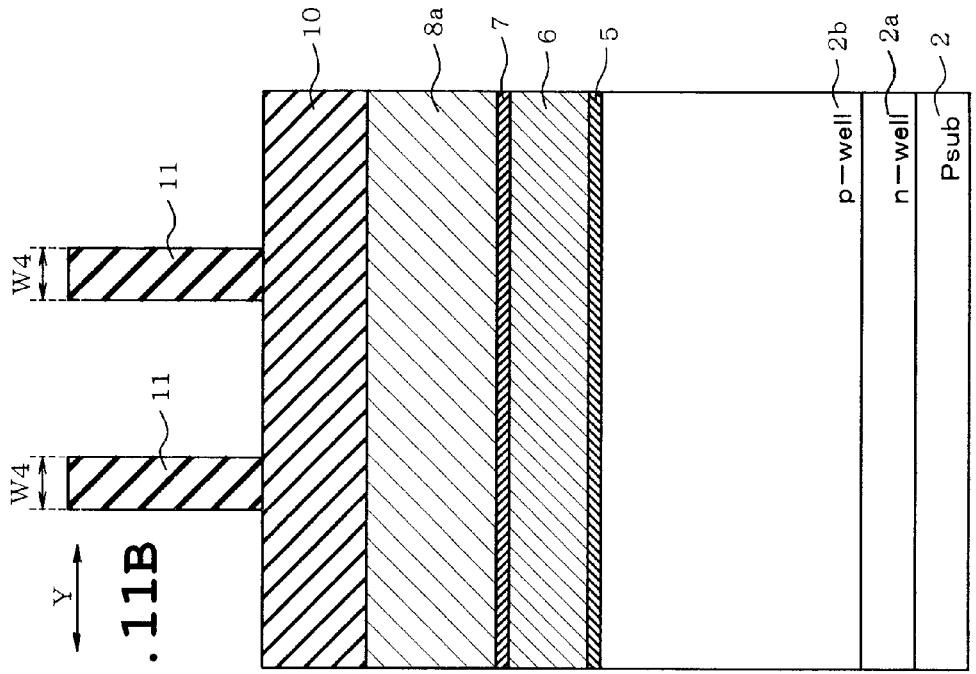
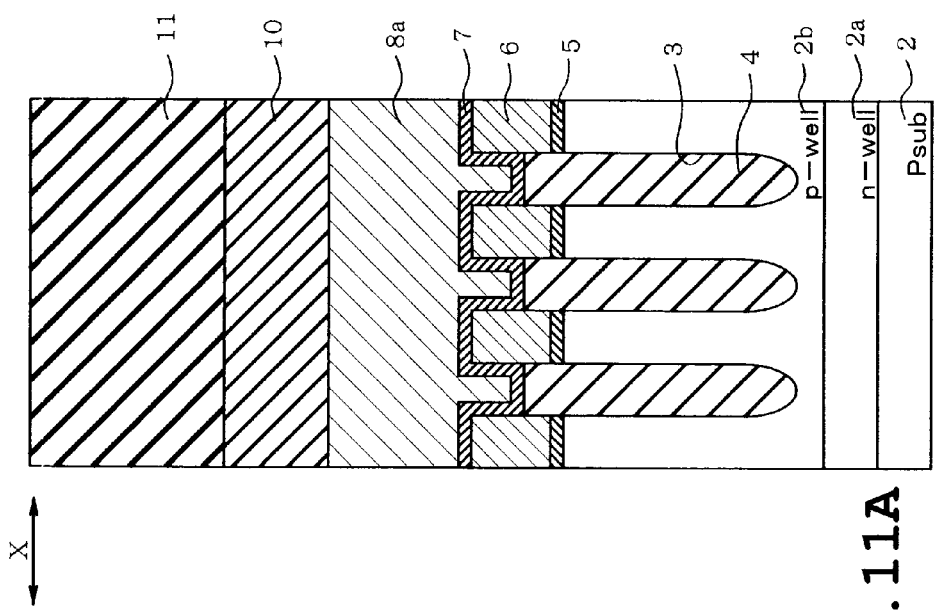

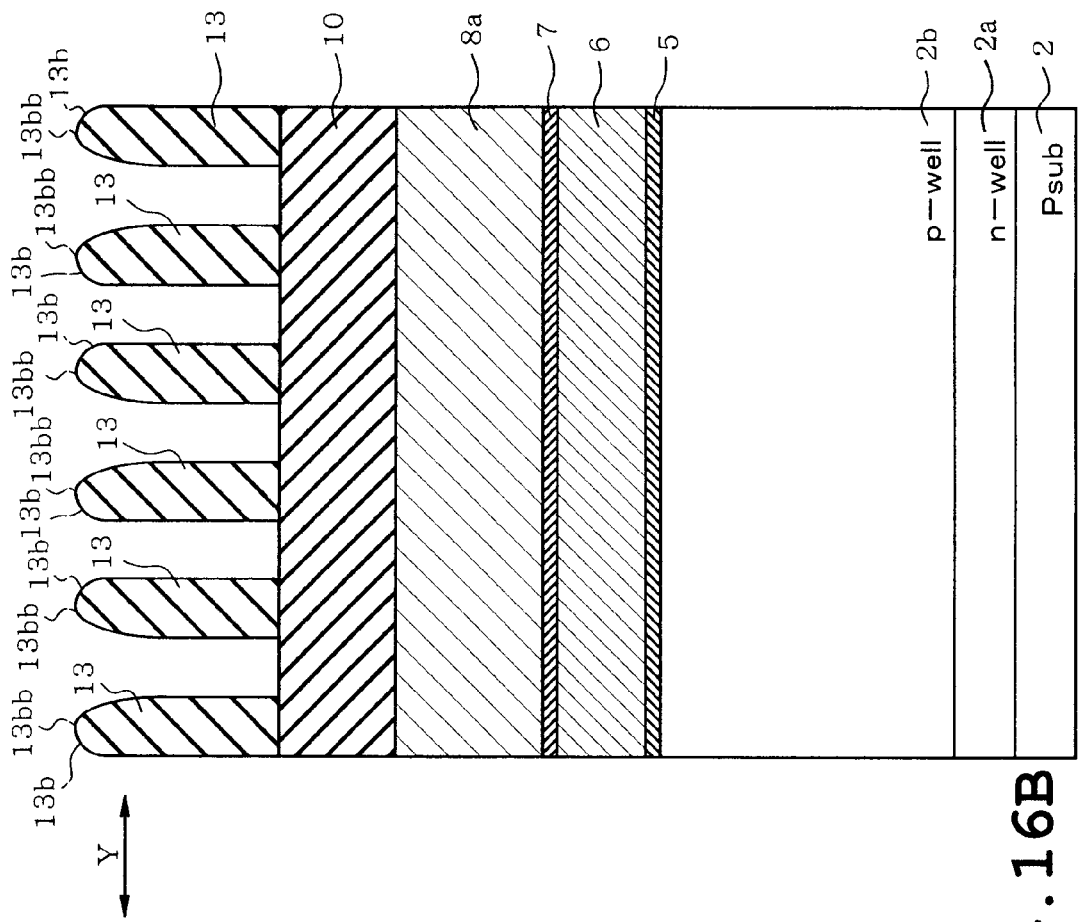
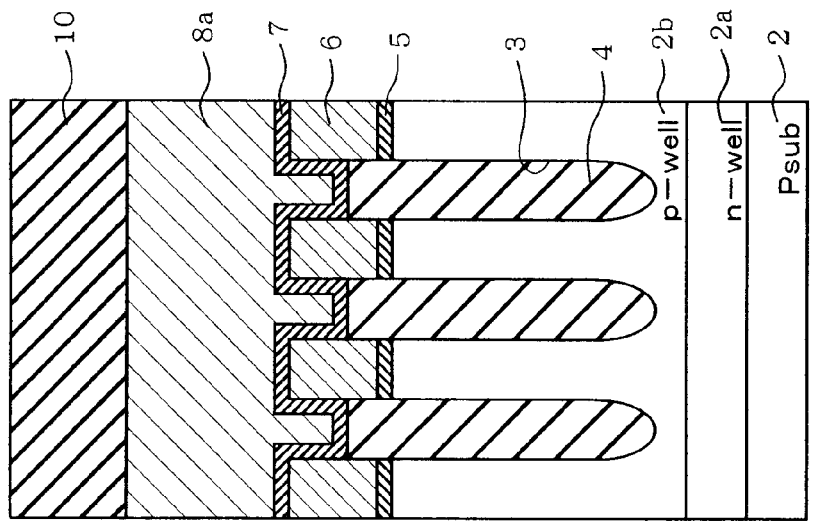

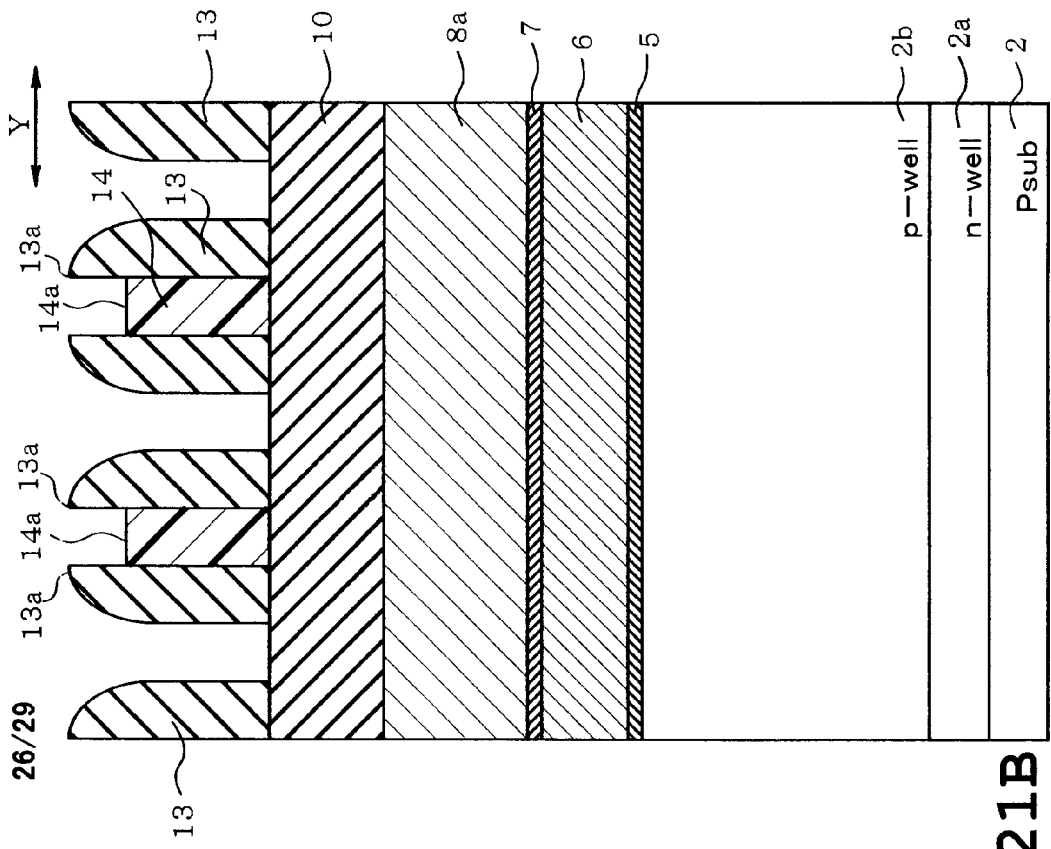
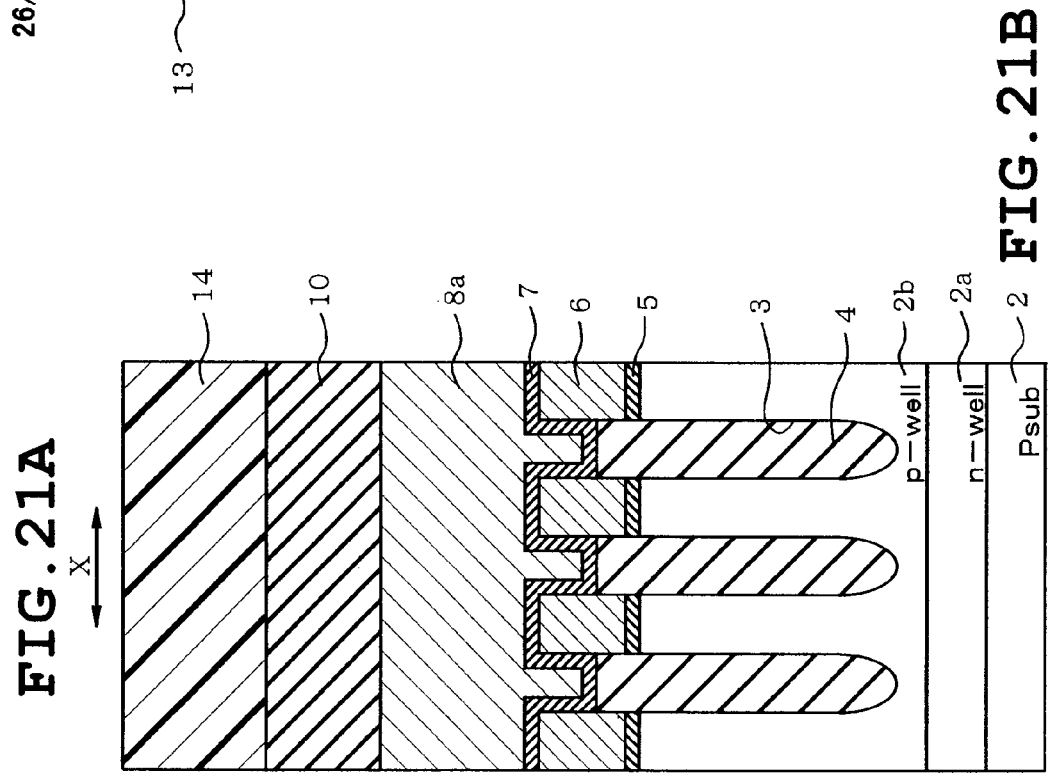

METHOD OF FABRICATING SEMICONDUCTOR DEVICE

CROSS-REFERENCE TO RELATED APPLICATIONS

This application is based on and claims the benefit of priority from the prior Japanese Patent Application No. 2009-22520, filed on Feb. 3, 2009, the entire contents of which are incorporated herein by reference.

BACKGROUND

1. Field

The present invention relates to a method of fabricating a semiconductor device, which is usable to form a microscopic pattern on a semiconductor substrate.

2. Related Art

In fabricating a memory with a high integration degree as a semiconductor device, for example, the memory needs to be microstructured. For this purpose, methods have been proposed to form patterns with microscopic pitches. These patterns are more microscopic than resolution limitations of current lithography techniques.

A sidewall transfer process is known as one of the aforesaid microscopic pattern forming methods. For example, U.S. Pat. No. 7,291,560 discloses a sidewall transfer process. In the disclosed sidewall transfer process, a first film is formed on a processed film and thereafter, the first film is etched and then patterned so that an upper surface of the processed film is exposed.

Subsequently, a second film having a higher selectivity than the first film is formed along an upper surface and side surfaces of the first film and the exposed upper surface of the processed film. The second film is anisotropically etched until the upper surface of the first film is exposed. Subsequently, the first film serving as a core material is removed, whereby a pattern is formed based on the second film.

Since the aforesaid second film is previously formed along the side surfaces of the first film, the second film is formed into an asymmetric shape in which the upper surface is inclined from an upper part of the side surface toward an outer lower part of the side surface. This results in alternate provision of two adjacent patterns having smaller and larger distances between upper ends of the patterns.

When the processed film is etched with the above-described pattern serving as a mask, a microloading effect results in differences in the etching depth since an opening width between upper ends of the mask differs. As a result, a difference in a processing shape in the processed film becomes marked.

SUMMARY

According to one aspect of the present invention, there is provided a method of fabricating a semiconductor device, comprising forming a first film on a processed film;

patterning the first film into a pattern with a smaller width and a space with a larger width, thereby exposing an upper surface of the processed film; forming a second film along an upper surface and side surface of the first film and an upper surface of the second film; etching the second film under a condition that the second film has a higher etch selectivity than the first film, thereby exposing the upper surfaces of the first film and the processed film while part of the second film remains along the side surface of the first film; etching the first film under a condition that the first film has a higher etch selectivity than the second film, so that an upper end of the first film is located lower than an upper end of the second film and so that the upper end of the first film is located higher than the processed film; etching an upper part of the second film under a condition that the upper part of the second film has a higher etch selectivity than the processed film, after the first film has been etched; removing the first film after the upper part of the second film has been etched; and etching the processed film with the second film serving as a mask after the first film has been removed.

BRIEF DESCRIPTION OF THE DRAWINGS

FIGS. 8A, 9A, 10A, 11A, 12A, 13A, 14A, 15A, 16A and 17A are longitudinal sections taken along line 17A-17A in FIG. 2, showing steps of fabrication respectively;

FIGS. 8B, 9B, 10B, 11B, 12B, 13B, 14B, 15B, 16B and 17B are longitudinal sections taken along line 3B-3B in FIG. 2, showing steps of fabrication respectively;

FIGS. 18A, 19A, 20A and 21A are schematic longitudinal sections taken along line 17A-17A in FIG. 2, showing steps of the fabrication method of a second embodiment respectively;

FIGS. 18B, 19B, 20B and 21B are schematic longitudinal sections taken along line 3B-3B in FIG. 2, showing steps of fabrication respectively.

DETAILED DESCRIPTION

A first embodiment will be described with reference to FIGS. 1 to 17B. The embodiment is directed to a process of fabricating a NAND flash memory. In the following description, identical or similar parts are labeled by the same reference symbols. The drawings typically illustrate the embodiments, and the relationship between a thickness and planar dimension, layer thickness ratio and the like differ from respective natural dimensions.

A NAND flash memory device 1 as a semiconductor device comprises a memory cell region M and a peripheral circuit region (not shown). The memory cell region M is provided with a memory cell array Ar including a number of memory cell transistors Trm arranged in a matrix. The peripheral circuit region is provided with peripheral circuits (not shown) to drive the memory cell transistors Trm.

Figure 1:
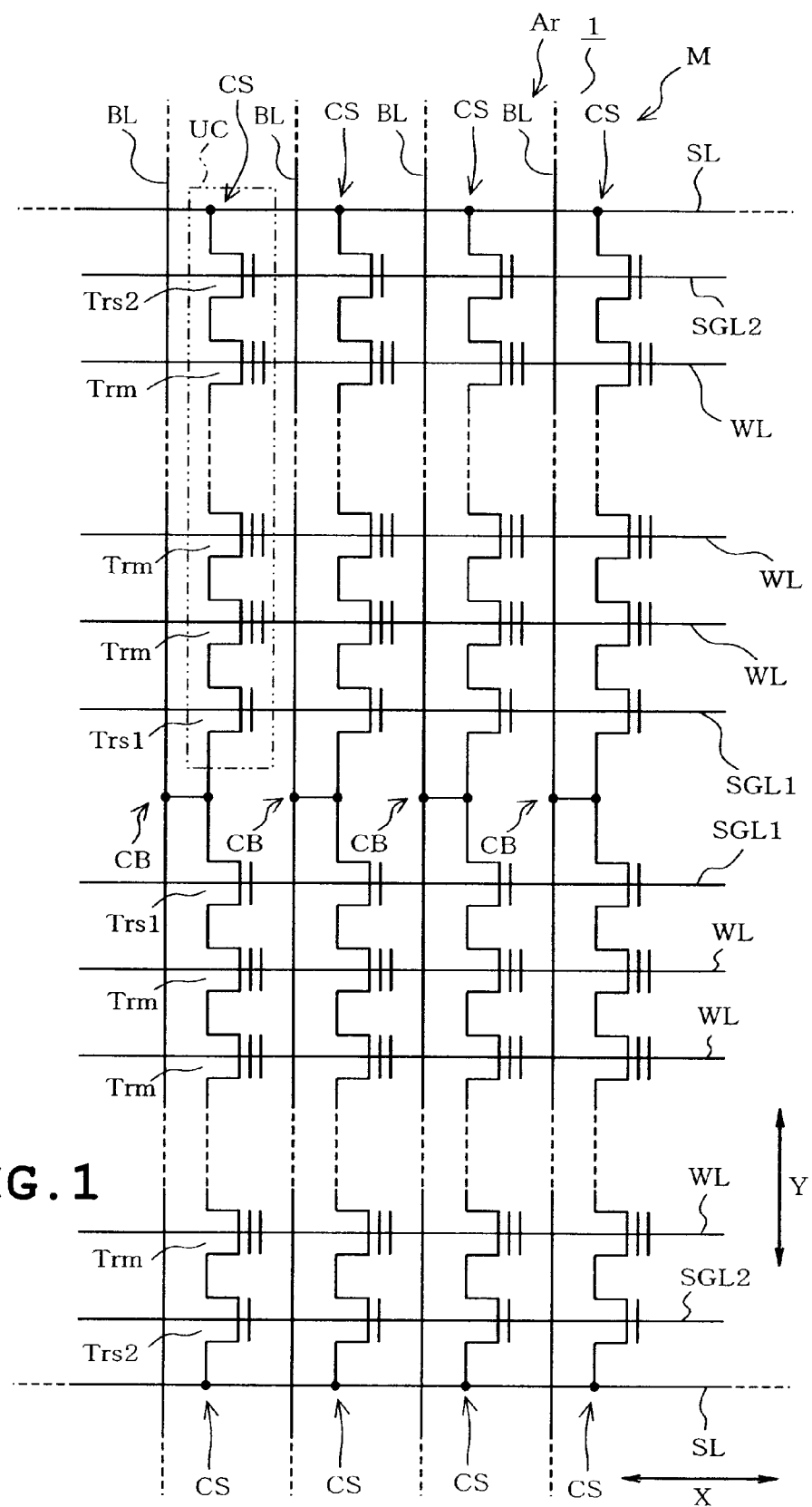
FIG. 1 shows an electrical arrangement of a part of memory cell region of a NAND flash memory fabricated by the method of a first embodiment in accordance with the present invention.

FIG. 1 shows an equivalent circuit of a part of the memory cell array in the flash memory. As shown, the memory cell array Ar includes NAND cell units UC arranged in rows and columns. Each NAND cell unit UC comprises two (a plurality of) selective gate transistors Trs1 and Trs2 and a plurality of, for example, 32, memory cell transistors Trm including the memory cell transistors Trm which are adjacent to each other between the selective gate transistors Trs1 and Trs2 and series connected to each other with a common source/drain region.

The memory cell transistors Trm which are arranged in the X direction (in the directions of word lines and channel width) and constitute each row are connected in common to a word line (control gate line) WL. Furthermore, the selective gate transistors Trs1 which are arranged in the X direction and constitute each row of the matrix are connected in common to a selective gate line SGL1. Yet furthermore, the selective gate transistors Trs2 which are arranged in the X direction and constitute each row of the matrix are connected in common to a selective gate line SGL2.

Figure 2:
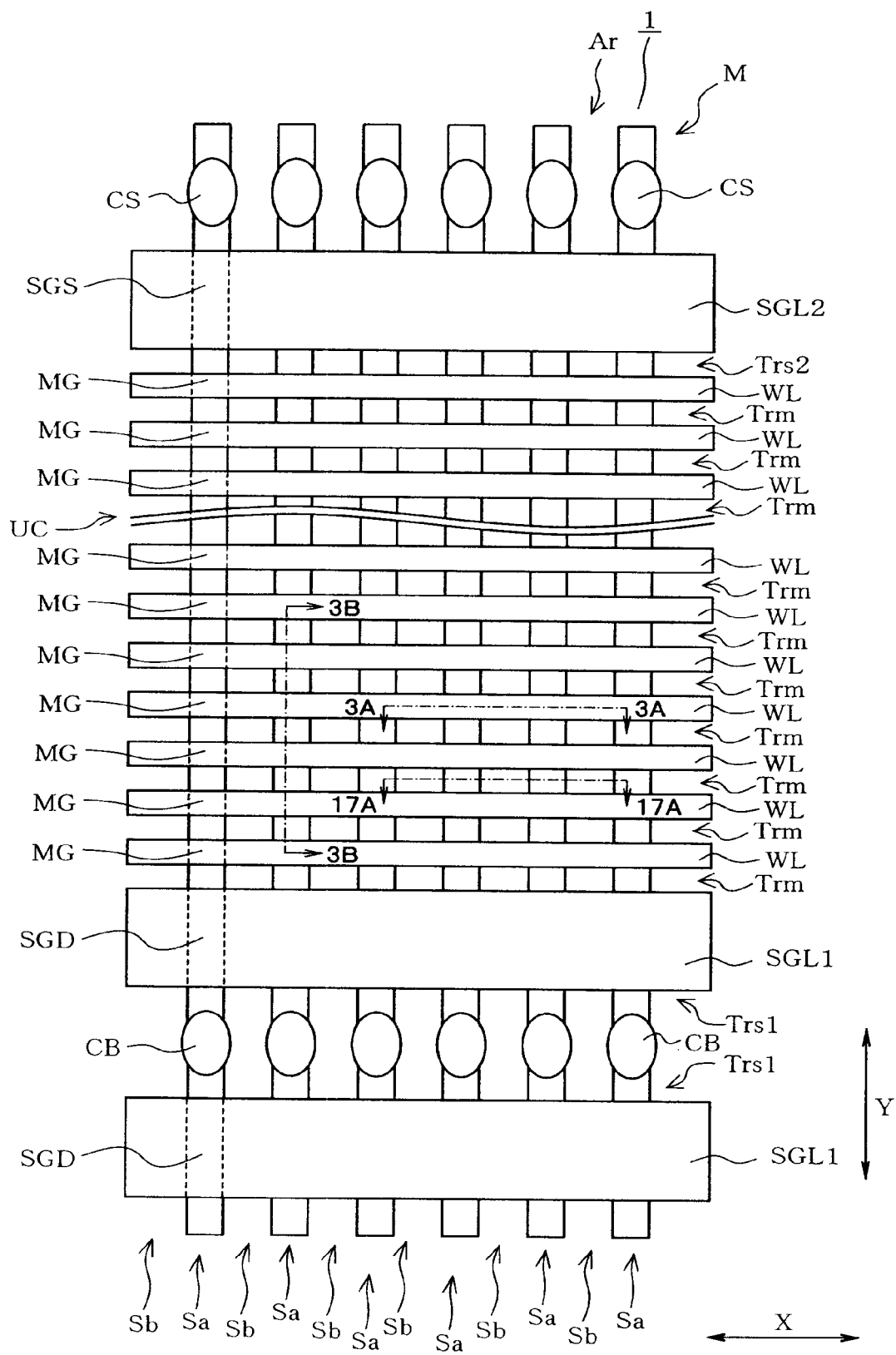
FIG. 2 is a schematic plan view showing a layout pattern of the memory cell region.

FIG. 2 shows a layout pattern of a part of the memory cell region. As shown, the NAND cell units UC are formed in active areas Sa divided by element isolation regions Sb each having a shallow trench isolation (STI) structure and extending in the Y direction. Selective gate electrodes SGD are configured in planar areas where the selective gate lines SGL1 and the active areas Sa cross. Selective gate electrodes SGS are configured in planar areas where the selective gate line SGL2 and the active areas Sa cross. Memory cell gate electrodes MG are configured at planar areas where the word lines WL and the active areas Sa cross.

Source line contacts CS are provided at the source side of the selective gate electrodes SGS, and the NAND cell units UC are electrically connected via the source line contacts CS to source lines SL (see FIG. 1). Bit line contacts CB are provided at the drain side of the selective gate electrodes SGD, and the NAND cell units UC are electrically connected via the bit line contacts CB to bit lines BL each extending in the Y direction.

Figure 3B:
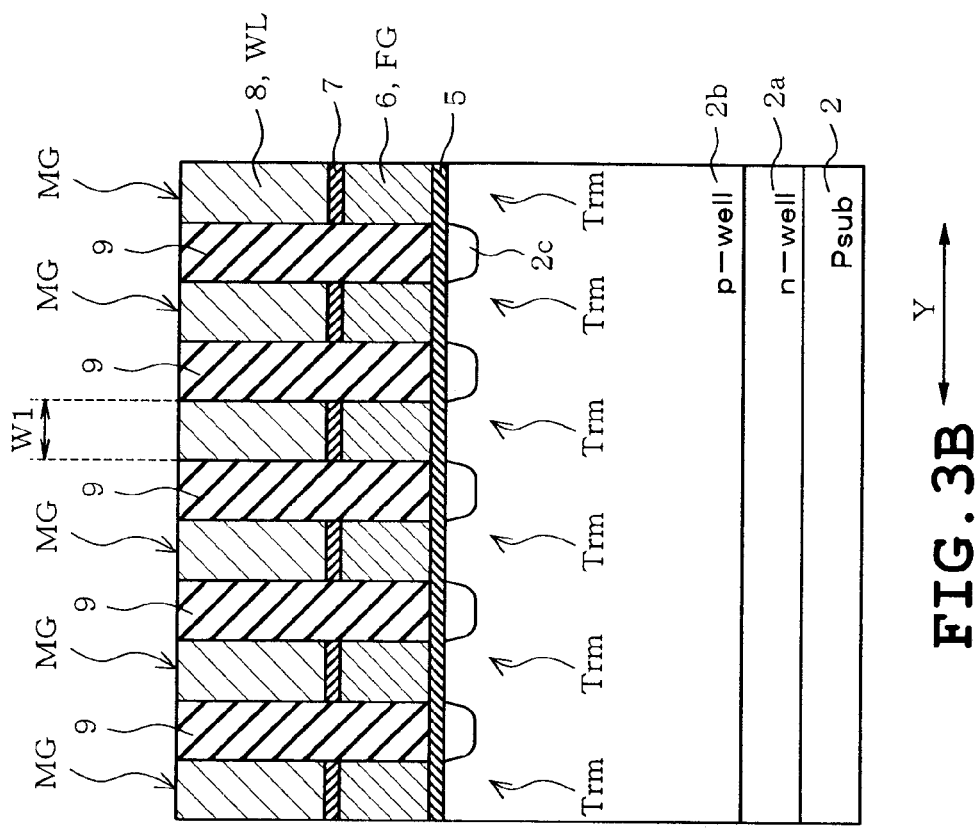
FIGS. 3A and 3B are schematic longitudinal sections taken along lines 3A-3A and 3B-3B in FIG. 2 respectively, each showing the gate electrode structure.
Figure 3A:
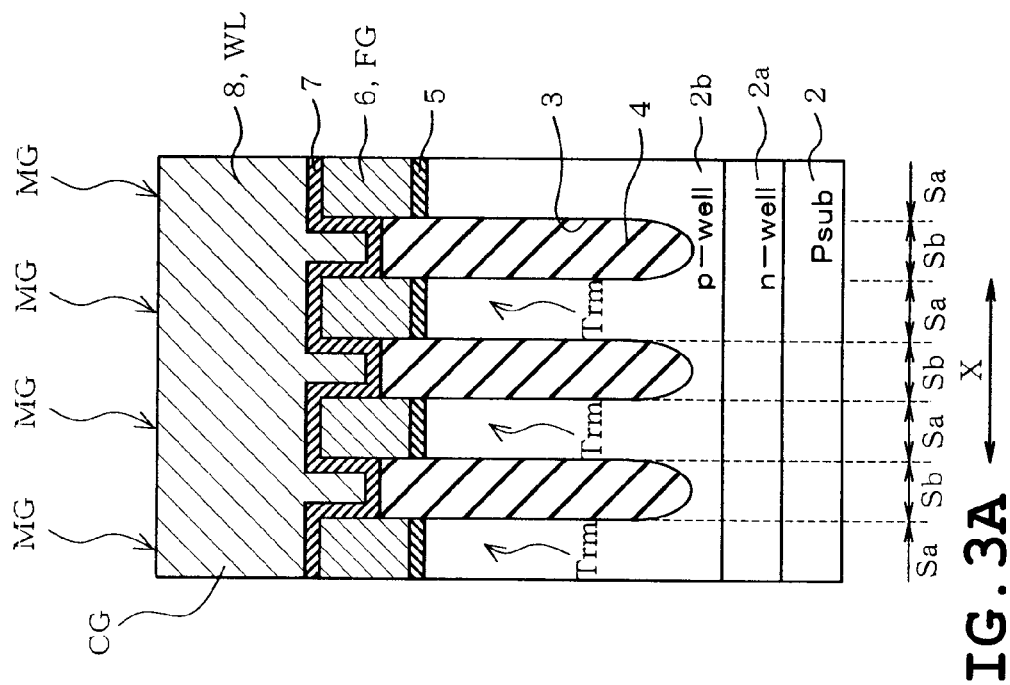

FIG. 3A shows a sectional structure taken along line 3A-3A in FIG. 2, and FIG. 3B shows a sectional structure taken along line 3B-3B in FIG. 2. The semiconductor substrate 2 has an n-well 2a formed in a surface layer thereof, and the n-well 2a has a surface layer in which a p-well 2b is formed. A plurality of element isolation trenches 3 are formed in the p-well 2b along the Y direction so as to be spaced in the X direction. A plurality of element isolation insulating films 4 are formed in the element isolation trenches 3 respectively, whereby element isolation regions Sb are formed. Each isolation insulating film 4 comprises a silicon oxide film such as a high temperature oxide (HTO) film or a spin-on glass (SOG) film, for example. The element isolation trenches 3 formed in the semiconductor substrate 2 are filled with the isolation insulating films 4 and have upper portions which protrude upward so as to be located above the upper surface of the semiconductor substrate 2, respectively. The element isolation insulating films 4 are spaced from one another in the X direction, and the active areas Sa are formed in the p-well 2b of the semiconductor substrate 2 so as to be located between the two element isolation insulating films 4 adjacent to each other. The active areas Sa have upper surfaces on which a gate insulating film 5 is formed.

The gate insulating film 5 comprises a silicon oxide film, for example and has two sides which are in contact with parts of the upper side surfaces of the element isolation insulating films 4 adjacent to each other. The gate insulating film 5 has an upper surface located lower than the upper surfaces of the element isolation insulating films 4. Polycrystalline silicon layers (serving as conductive layers and semiconductor layers) 6 are formed as floating gate electrodes FG on the gate insulating film 5. Each polycrystalline silicon layer 6 has upper side surfaces protruding above the upper surfaces of the element isolation insulating films 4 and lower side surfaces serving as contact surfaces contacting upper side surfaces of each element isolation insulating film 4. The upper side surfaces of each element isolation insulating film 4 protrudes upward from the surface of the semiconductor substrate 2 and are formed so as to be coplanar with the side surface of the gate insulating film 5 and the lower side surfaces of the adjacent polycrystalline silicon layers 6.

An intergate insulating film 7 is formed along the upper surfaces of the element isolation insulating films 4, upper side surfaces and upper surfaces of the polycrystalline silicon layers 6. The intergate insulating film 7 serves as an interpoly insulating film, an inter-conductive layer insulating film and an interelectrode insulating film. The intergate insulating film 7 comprises a silicon oxide film-silicon nitride film-silicon oxide film (ONO) film or the ONO film with a nitride film layer on the upper and/or lower layer.

A conductive layer 8 is formed on the intergate insulating film 7 along the X direction (the direction of word line). The conductive layer 8 functions as the word lines WL each of which connects control electrodes CG of the memory cell transistors Trm. The conductive layer 8 is configured into a structure with a silicide layer silicided by a metal on the polycrystalline silicon layer. Alternatively, the conductive layer 8 may consist of a polycrystalline silicon layer. Thus, a gate electrode MG of each memory cell transistor Trm may comprise the floating gate electrode FG, the intergate insulating film 7 and the control gate CG all of which are formed into a stacked gate structure on the gate insulating film 5.

The gate electrodes MG of the memory cell transistors Trm are arranged in the Y direction as shown in FIG. 3B. Each gate electrode MG is divided from one another structurally and electrically. Interlayer insulating films 9 are formed in the divided regions respectively. Each interlayer insulating film 9 comprises a silicon oxide film, for example. A Y-direction dimension of each gate electrode MG will be referred to as "width W1."

Two diffusion layers (source/drain regions) 2c are formed at both opposite sides of each memory cell gate electrode MG so as to be located in the surface layer of the semiconductor substrate 2, as shown in FIG. 3B. Each memory cell transistor Trm thus includes the gate insulating film 5, the gate electrode MG and the source/drain region 2c.

A method of fabricating the foregoing flash memory will now be described. The plural memory cell gate electrodes MG are configured so as to be spaced away from one another in the Y direction. The Y-direction dimension of each memory cell gate electrode MG and the Y-direction intervals need to be microstructured or refined for the purpose of improving a degree of integration. In the embodiment, when each memory cell gate electrode MG is divided into a plurality of parts in the Y direction, the memory cell gate electrode MG is divided with a pitch that is more microscopic than a limit of resolution of a current lithography process in order that the integration degree may be improved.

Figure 4:
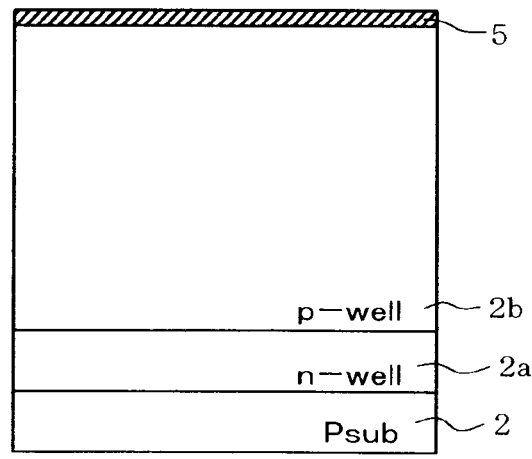
FIGS. 4 to 7 are schematic longitudinal sections taken along line 17A-17A in FIG. 2, showing steps of fabrication respectively.
Figure 5:
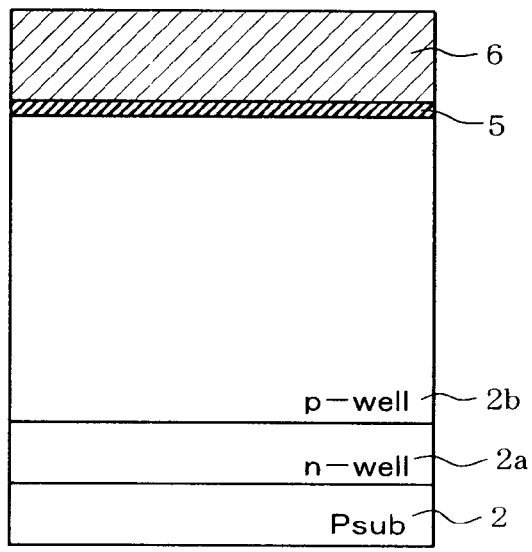

FIGS. 4 to 7 show a schematic sectional structure at one fabrication step, which structure is common to the longitudinal sections along line 3A-3A and line 17A-17A in FIG. 2. As shown in FIG. 4, an n-well 2a and the p-well 2b are formed in the surface layer of the p-type semiconductor substrate 2. After impurities (not shown) for channel forming have been implanted, the gate insulating film 5 having a predetermined film thickness is formed on the upper surface of the semiconductor substrate 2 by a thermal oxidation method. Subsequently, an amorphous silicon film with a predetermined film thickness is deposited on the gate insulating film 5 by a chemical vapor deposition (CVD) method as shown in FIG. 5. Reference symbol "6" is applied to the amorphous silicon since the amorphous silicon is formed as the polycrystalline silicon layer 6 to which a thermal treatment will be applied thereby to be formed into the floating gate electrodes FG.

Figure 6:
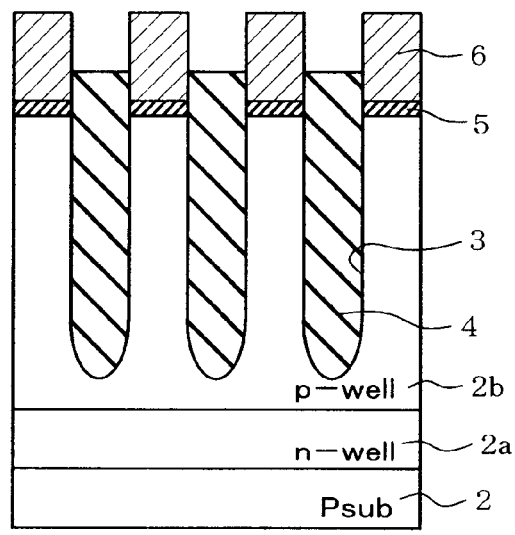
Figure 7:
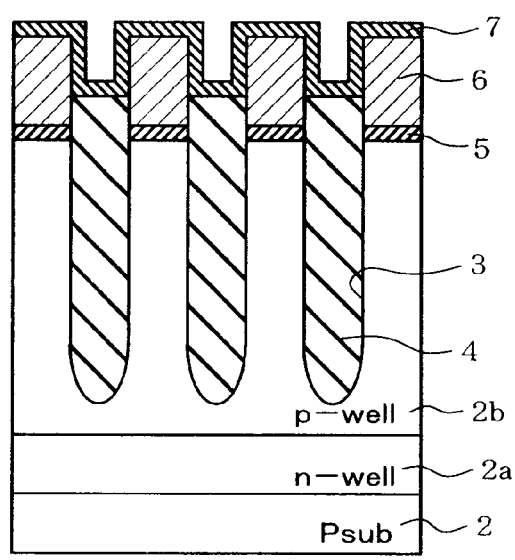

Subsequently, a mask (not shown) is formed on the polycrystalline silicon layer 6 as shown in FIG. 6. The polycrystalline silicon layer 6, the gate insulating film 5 and the surface layer of the semiconductor substrate 2 are anisotropically etched by a reactive ion etching (RIE) method using the mask so that the element isolation trenches 3 are formed. The element isolation trenches 3 are filled with the element isolation insulating films 4 respectively, and an etchback process is executed so that the upper surfaces of the element isolation insulating films 4 are located lower than the upper surfaces of the polycrystalline silicon films 6 and higher than the upper surface of the gate insulating film 5. Subsequently, for example, the ONO film is formed by the CVD method, whereby the intergate insulating film 7 is formed along the upper surfaces and upper side surfaces of the polycrystalline silicon films 6 and the upper surfaces of the element isolation insulating films 4, as shown in FIG. 7.

Figure 8B:
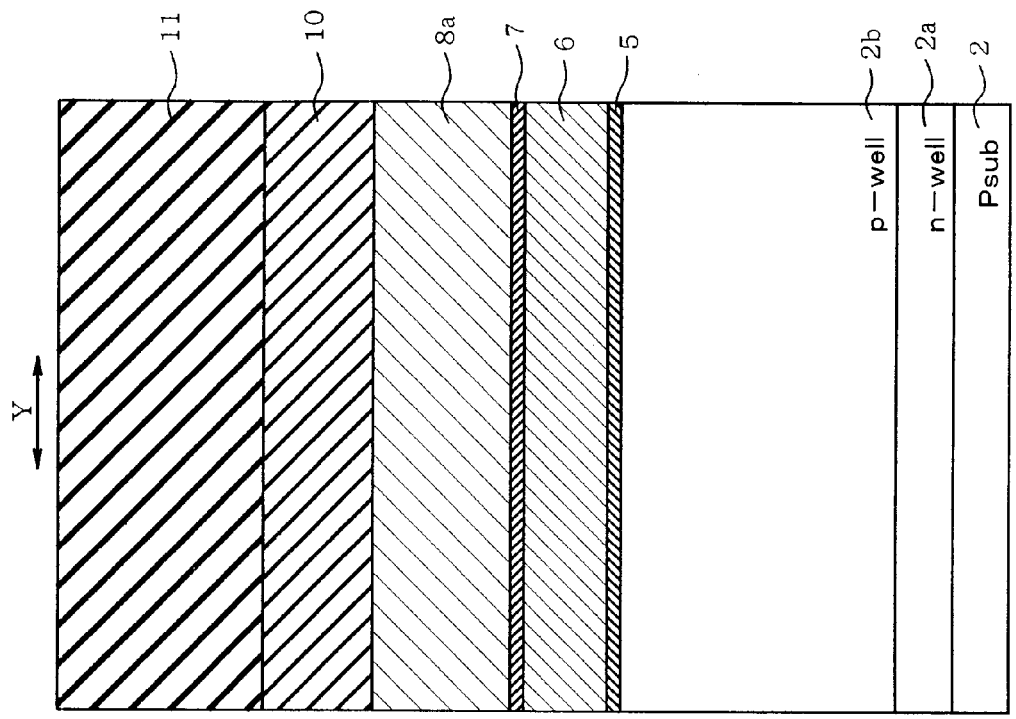
Figure 8A:
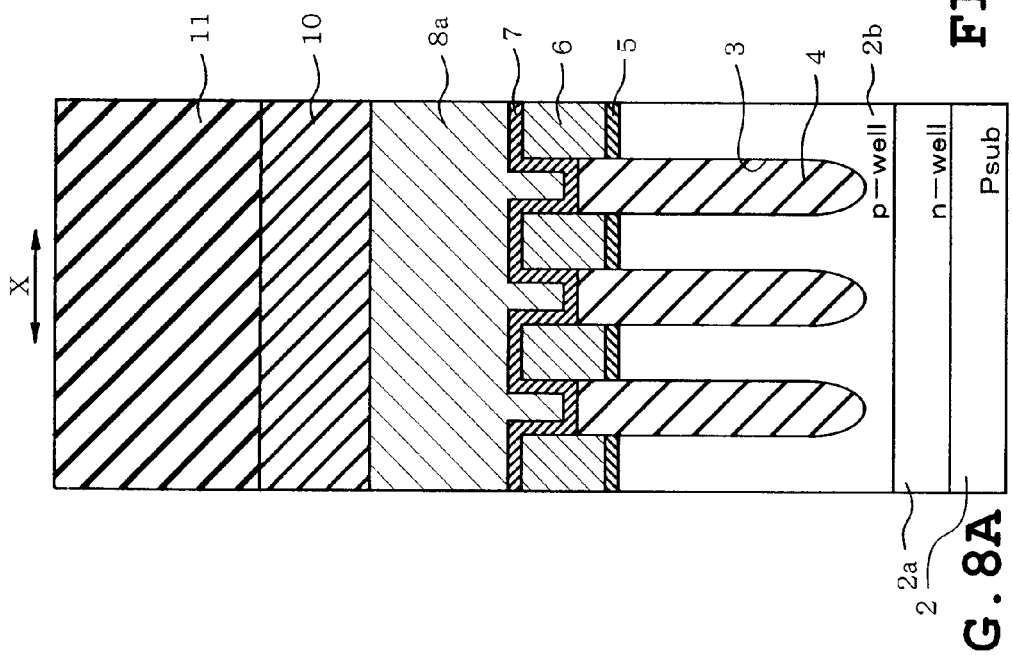

Regarding FIGS. 8A to 17B, figures with the numbers to which suffixes "A" are attached schematically show the longitudinal sections taken along line 17A-17A in FIG. 2 in one fabrication step, and figures with the numbers to which suffixes "B" are attached schematically show the longitudinal sections taken along line 3B-3B in FIG. 2 at the fabrication step. A silicon layer 8a constituting the conductive layer 8 is deposited on the intergate insulating film 7 by the CVD method as shown in FIGS. 8A and 8B. Subsequently, a silicon nitride film 10 serving as a processed film is deposited on a stacked structure of the films 6 and 7 and layer 8a. A silicon oxide film 11 serving as a core material and as a first film is then deposited on the silicon nitride film 10 by the CVD method.

Figure 9A:
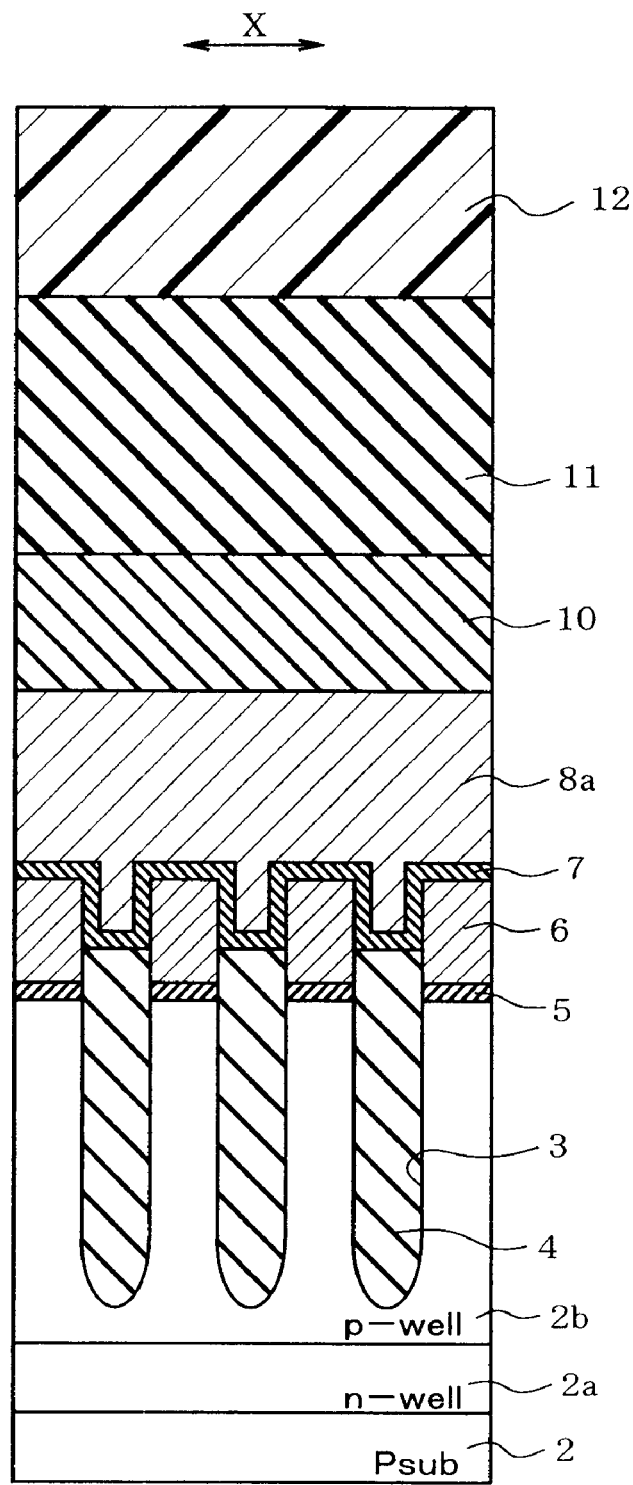
Figure 9B:
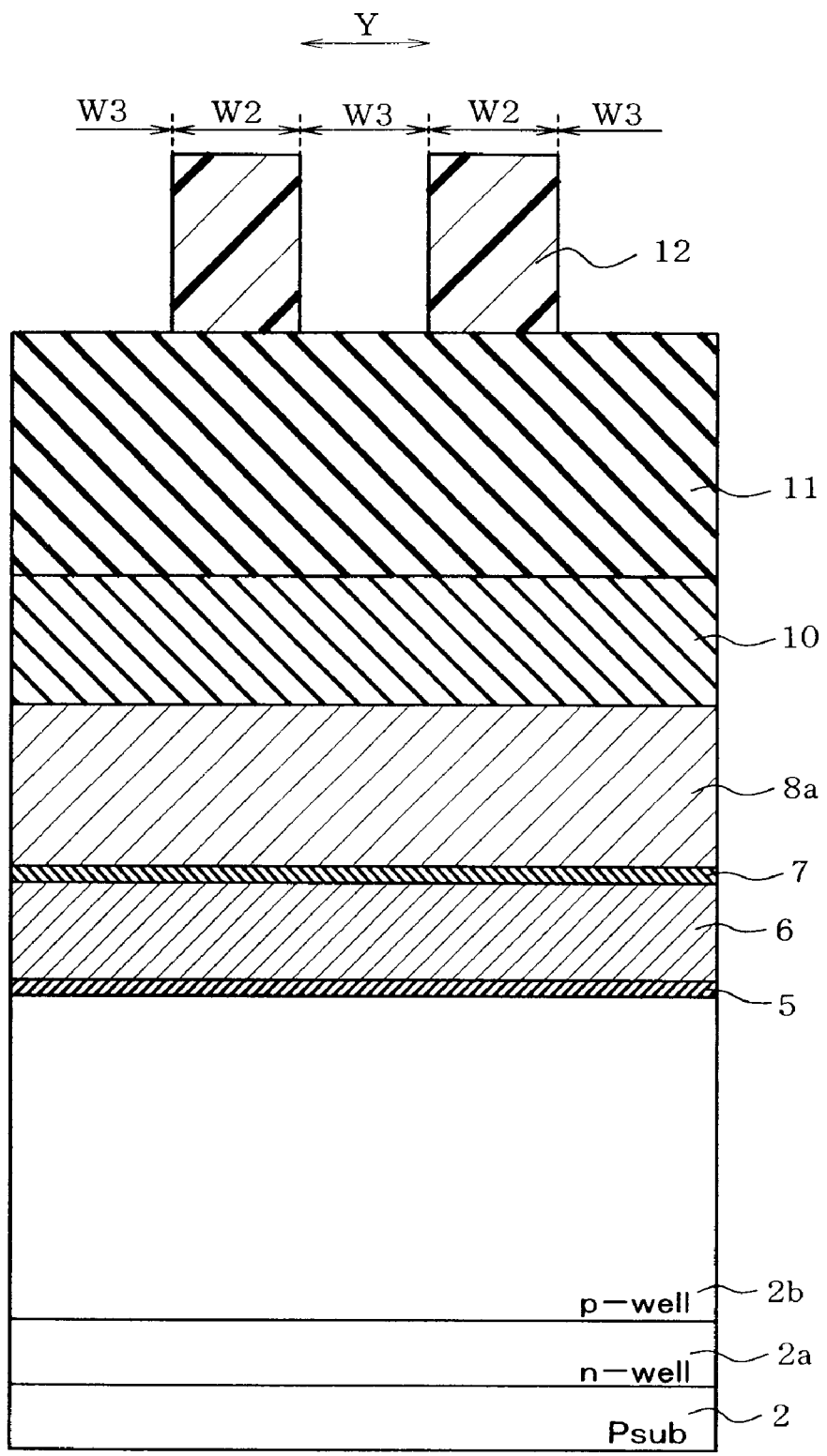

Subsequently, a resist 12 is coated on the silicon oxide film 11 and then patterned as shown in FIGS. 9A and 9B. A patterned area of the resist 12 is spaced in the Y direction and extends linearly along the X direction after execution of the patterning as shown in FIG. 9B. A line pattern width W2 in FIG. 9B is substantially twice as long as the Y direction width W1 of the gate electrode MG. The line pattern after execution of the patterning at this time is formed with such a pitch as not to exceed the resolution limit of the currently available lithography technique. The line pattern is processed into a line pattern exceeding the resolution of the lithography technique by the subsequent processing. A space between adjacent line patterns has a width W3 that is substantially the same as the line pattern width W2 and substantially twice as long as the finally formed Y direction pattern width W1.

Figure 10B:
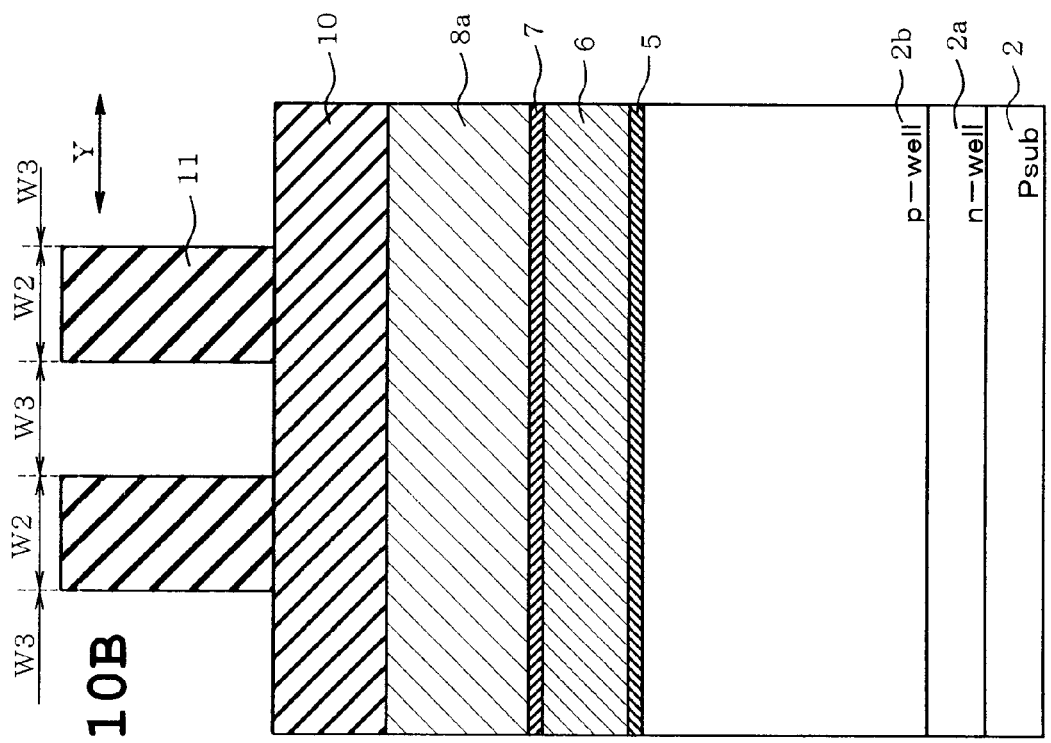
Figure 10A:
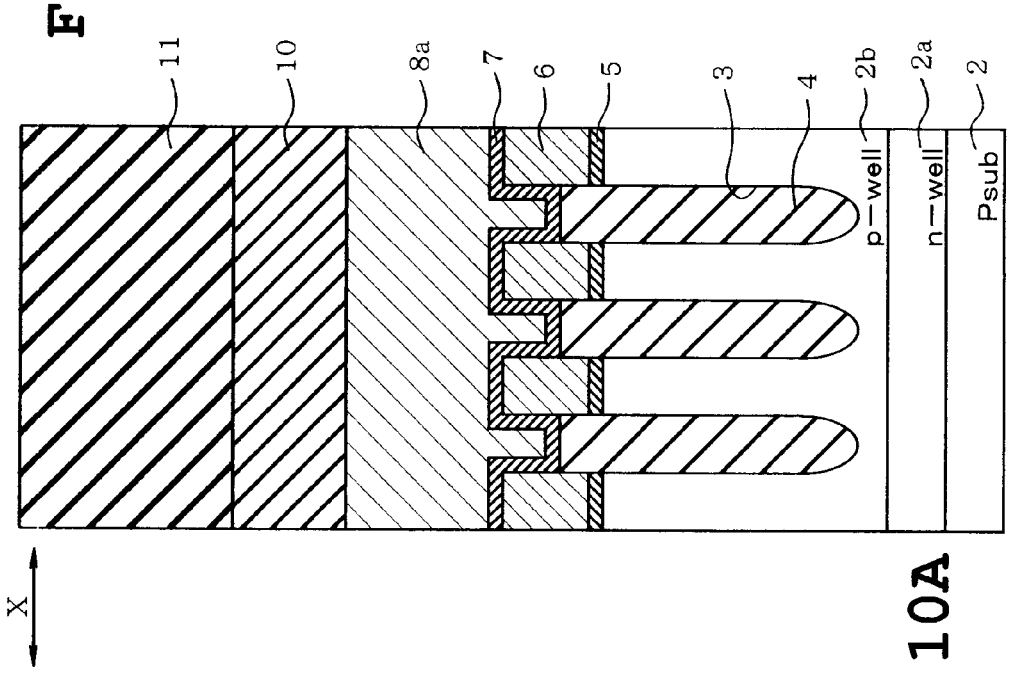

Subsequently, the silicon oxide film 11 is exposed to plasma of a fluorocarbon (CF) gas and anisotropically etched by the RIE method with the patterned resist 12 serving as a mask thereby to be divided into a plurality of line patterns, as shown in FIGS. 10A and 10B. Each divided silicon oxide film 11 has a Y direction width that is substantially the same as the width W2. An upper surface of the silicon nitride film 10 is partially exposed as the result of the dividing process. The silicon oxide film 11 is then exposed to $O_2$-plasma so that the resist 12 is removed.

An isotropic etching process is executed to render the line patterns of the silicon oxide film 11 thinner as shown in FIGS. 11A and 11B. In this case, the isotropic etching process to be applied to includes wet etching by the use of hydrofluoric acid (HF) and dry etching. As a result, an exposed area of the upper surface of the silicon nitride film 10 is increased. The Y direction pattern width W4 obtained after refinement of the silicon nitride film 10 is adjusted so as to correspond substantially with the width W1.

Figure 12A:
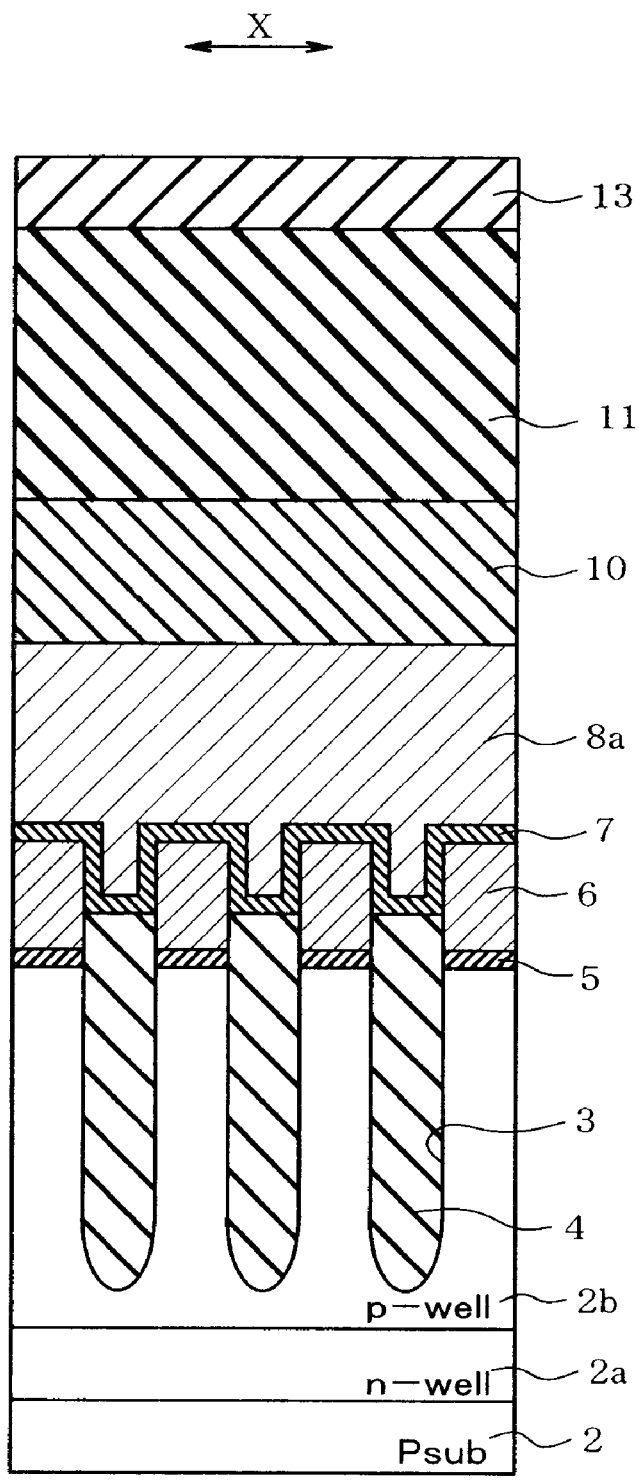
Figure 12B:
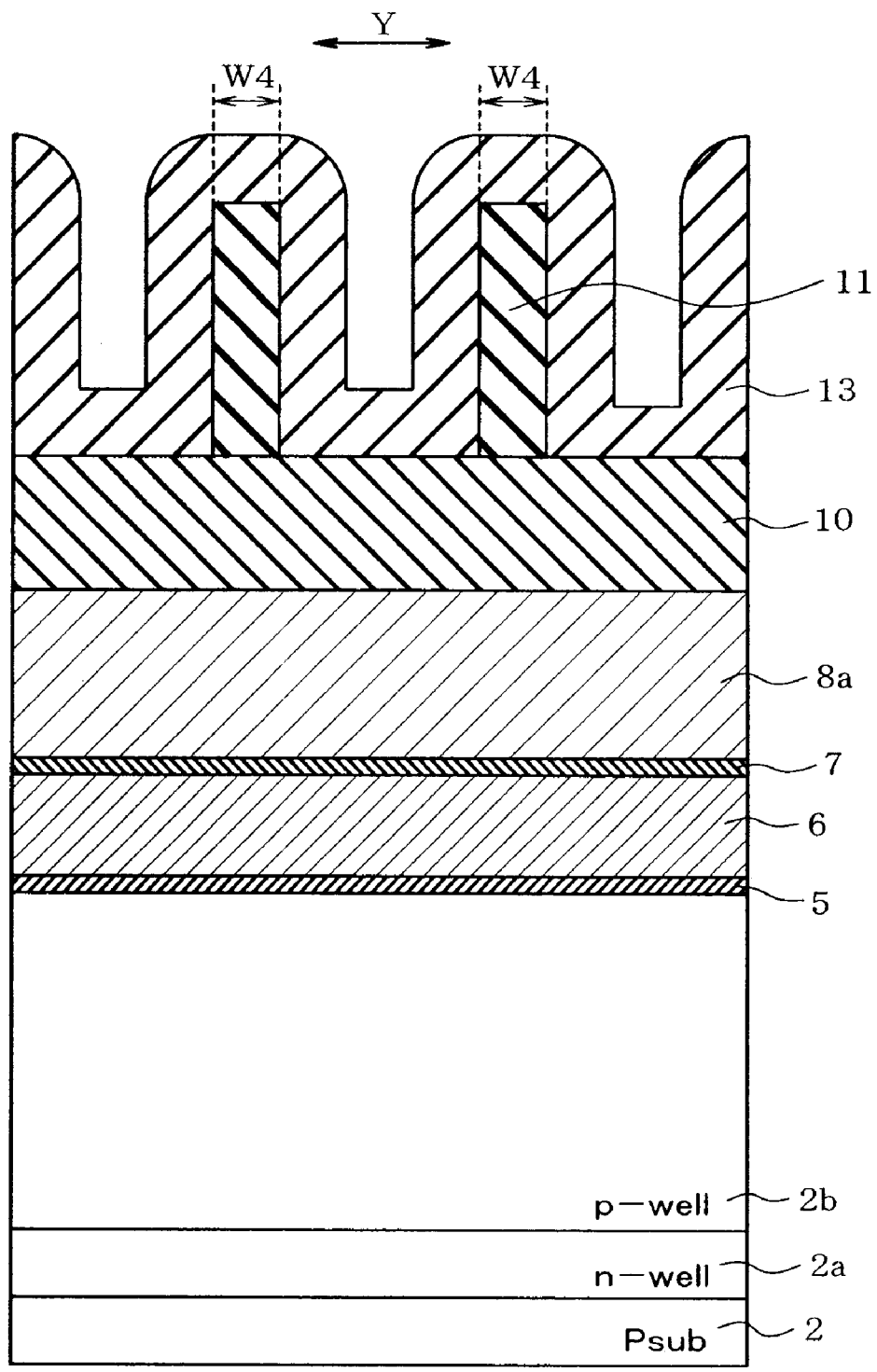

Subsequently, the amorphous silicon film 13 serving as a second film and a sidewall spacer is stacked on the silicon oxide film 11 by the CVD method as shown in FIGS. 12A and 12B. The amorphous silicon film 13 is formed along upper and side surface of the silicon oxide film 11 and the exposed upper surface of the silicon nitride film 10. The amorphous silicon film 13 has a film thickness that is set so as to substantially the same as the pattern width W1 of the gate electrodes MG. An etch selectivity can easily be obtained between the amorphous silicon film 13 and each of the silicon oxide and nitride films 11 and 10.

Figure 13A:
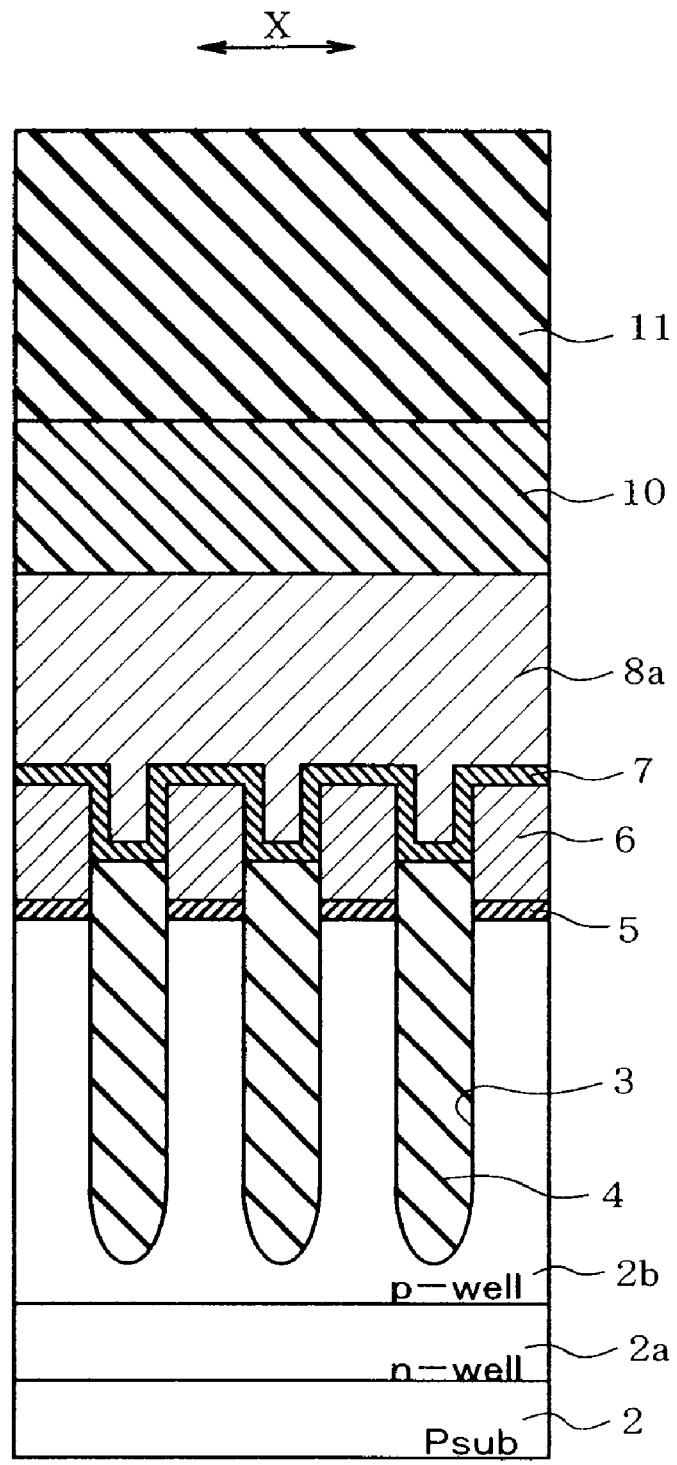
Figure 13B:
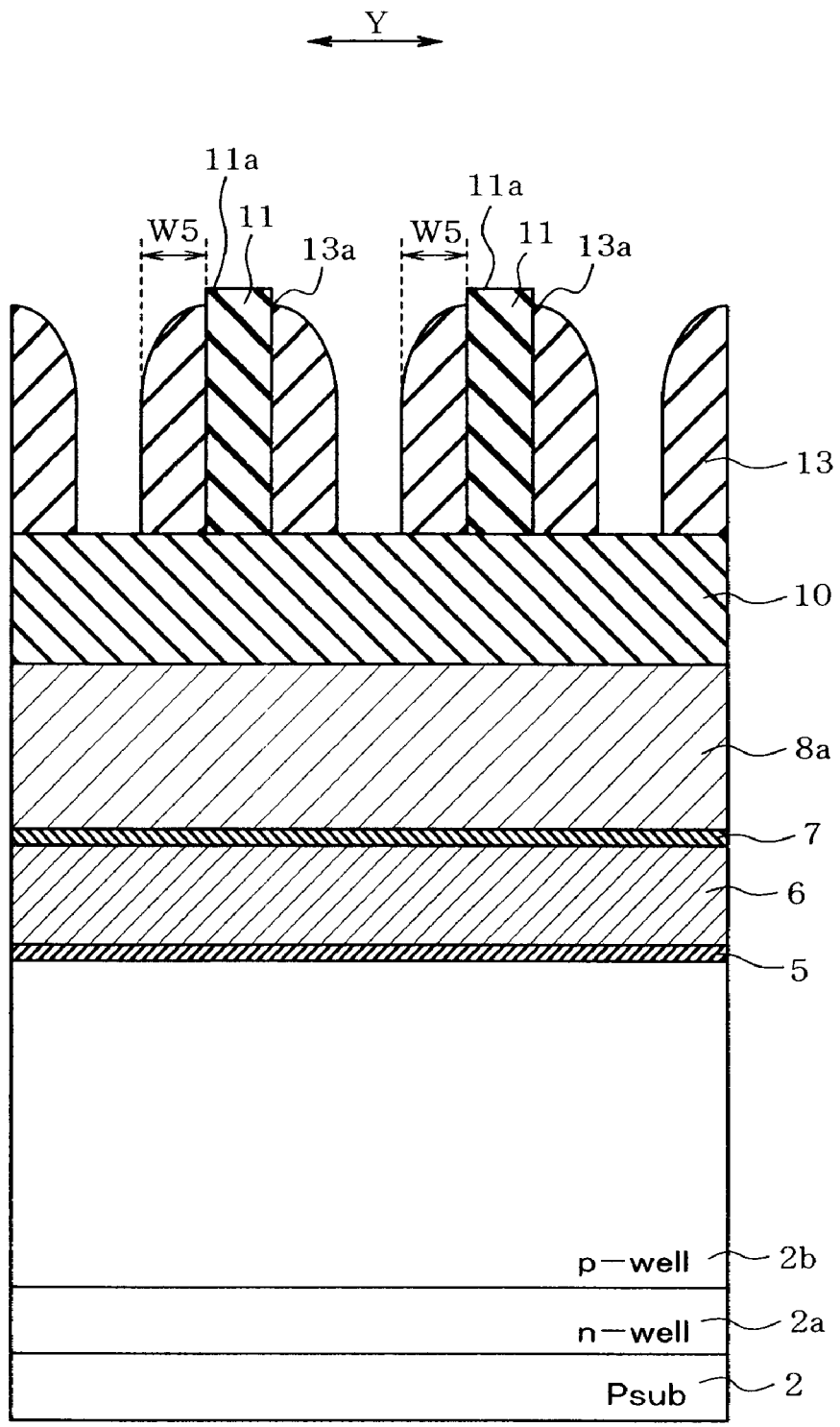

Subsequently, the amorphous silicon film 13 is dry-etched (anisotropic etching by the RIE method) until the upper surface of the silicon oxide film 11 is exposed, as shown in FIGS. 13A and 13B. When, for example, a halogen gas including chlorine gas ($Cl_2$) and hydrogen bromide (HBr) is used in this case, a dry etching process is executed under the etching condition that the amorphous silicon film 13 has a higher selectivity than the silicon oxide and nitride films 11 and 10. As a result, the amorphous silicon film 13 remains in the form of a spacer along side surfaces of the silicon oxide films 11 serving as core materials. The remaining amorphous silicon film 13 is located so that an upper end 13a thereof is in contact with an upper part of the side surface of the silicon oxide film 11 and is shaped so that an upper side thereof is convexly curved toward the outside of the silicon oxide film (core material) 11.

The amorphous silicon film 13 has an upper surface that is curved gently convexly toward the outwardly downward from the upper end 13a. Since the amorphous silicon film 13 remains along the side surfaces of the silicon oxide film 11, an angle between the upper surface and side surface of the amorphous silicon film 13 takes the form of an acute angle. At this stage of fabrication, the amorphous silicon film 13 is divided by removing a part thereof in the middle of the adjacent silicon oxide films 11. The amorphous silicon film 13 remaining at this time has a spacer width that substantially corresponds with the width W1.

Figure 14A:
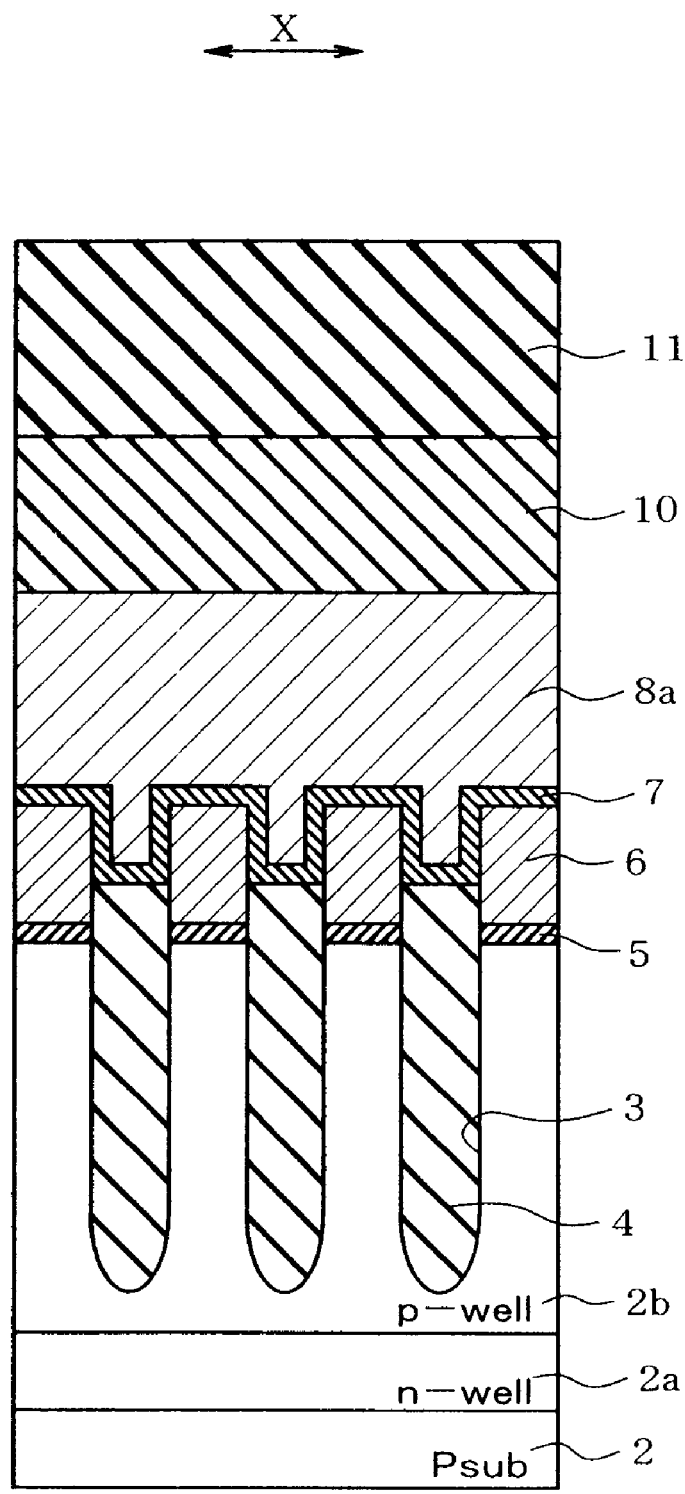
Figure 14B:
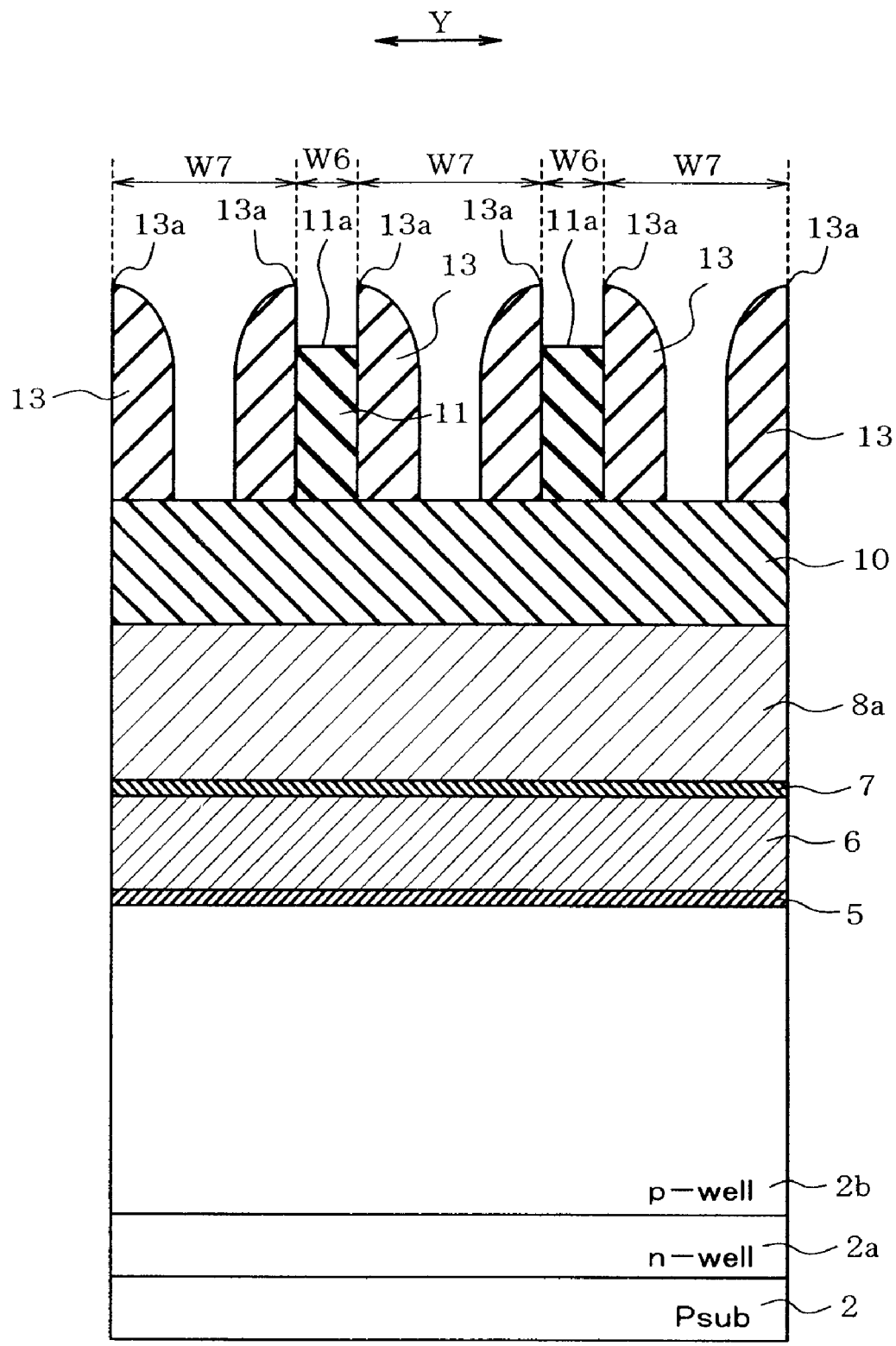

Subsequently, upper portions of the silicon oxide films 11 are removed as shown in FIGS. 14A and 14B. As the result of the removing process, upper ends 11a (upper surfaces) of the silicon oxide films 11 are adjusted so as to be located lower than the upper ends 13a of the amorphous silicon films 13 and higher than the upper surface of the silicon nitride film 10. The process of removing the silicon oxide films 11 is executed under the etching condition that the silicon oxide film 11 has a higher selectivity than the silicon nitride film 10 and the amorphous silicon films 13. It is better to apply a dry etching by the use of a fluorocarbon gas (anisotropic etching by the RIE method) to this removing process. When distances W6 and W7 between the upper ends 13a of the adjacent amorphous silicon films 13 are compared at this stage of fabrication, the narrower widths W6 and the broader widths W7 are alternately found.

Figure 15A:
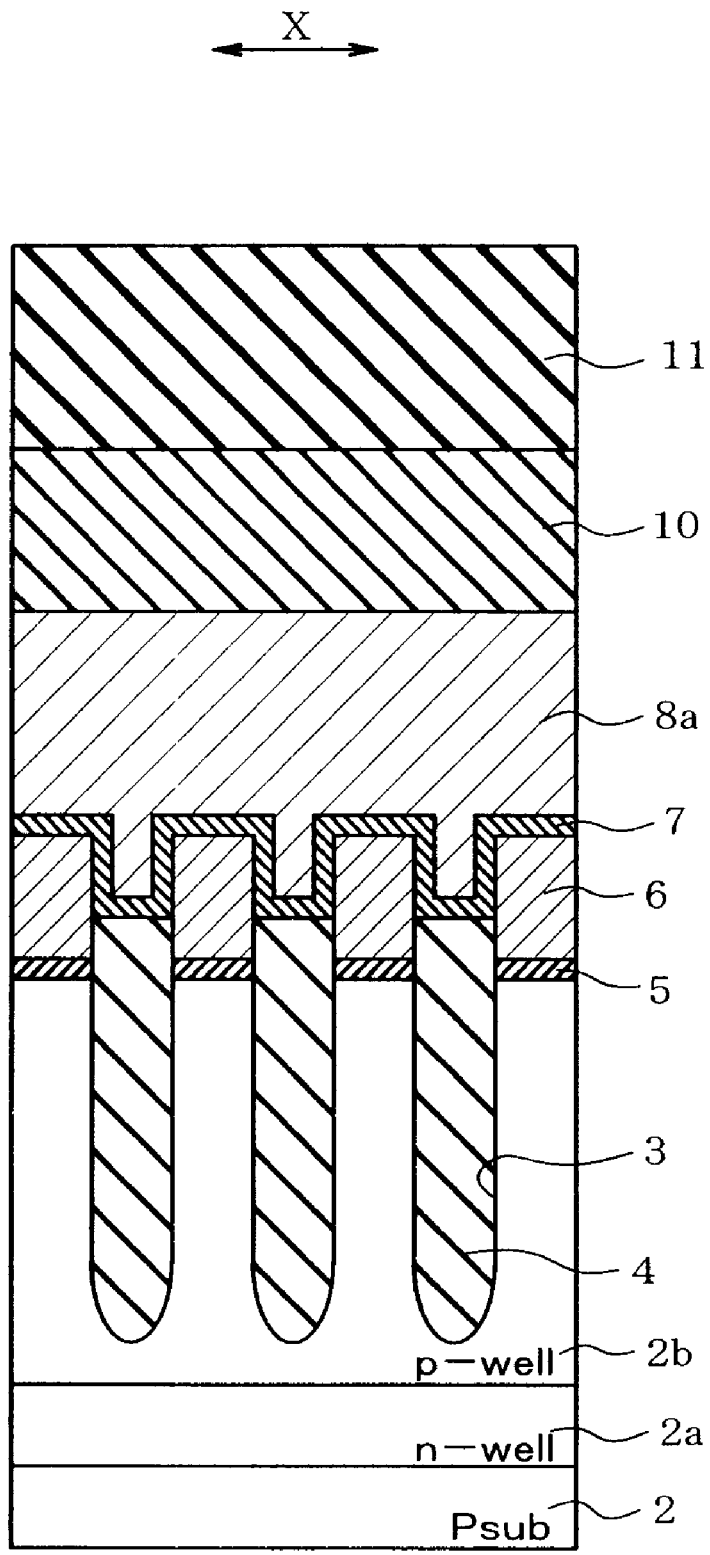
Figure 15B:
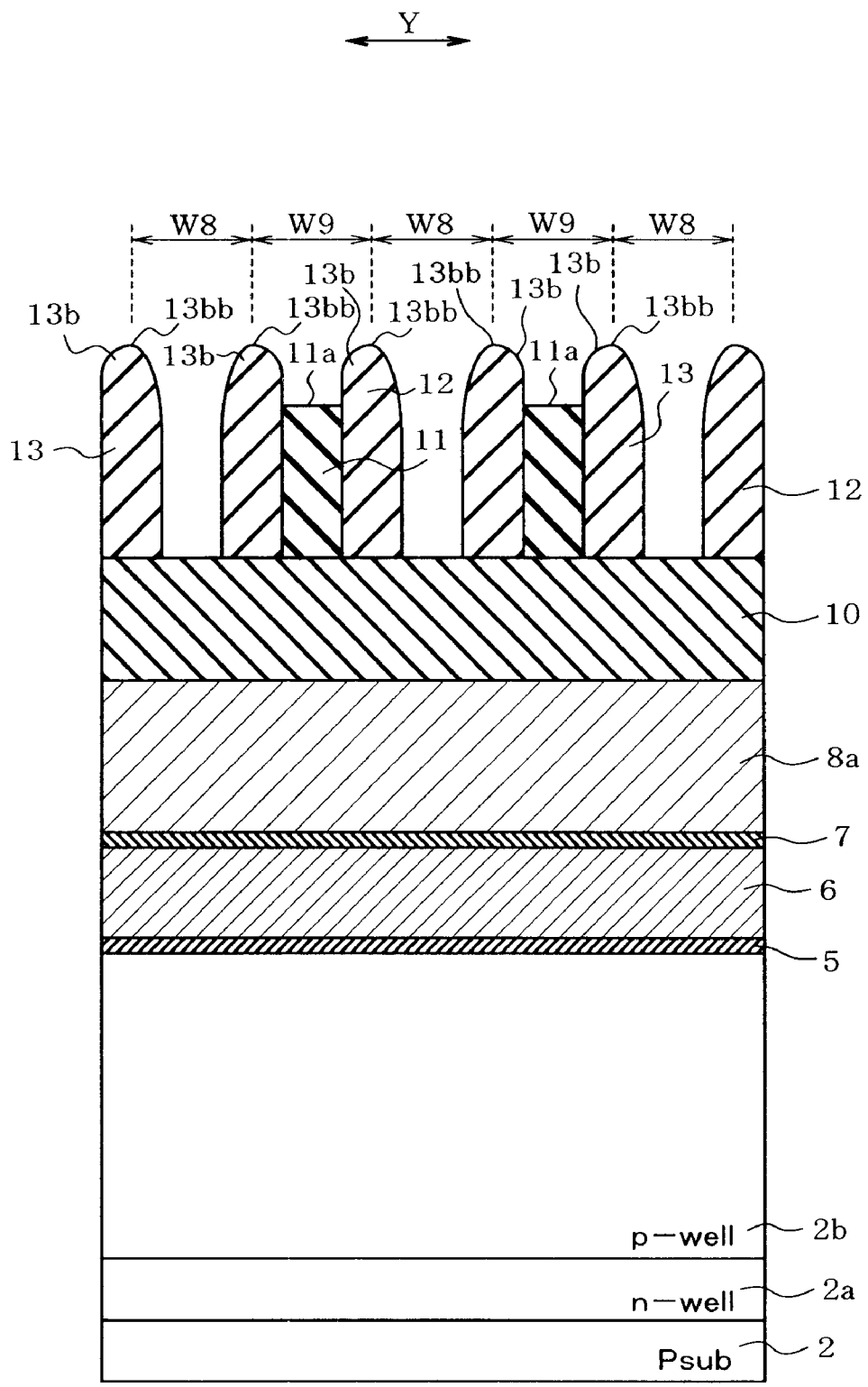

Subsequently, the upper portions of the amorphous silicon films 13 is dry-etched under the condition that the amorphous silicon film 13 has a higher selectivity than the silicon nitride film 10 (anisotropic etching by the RIE method) as shown in FIGS. 15A and 15B. This process is carried out using a halogen gas including chlorine gas ($Cl_2$) and hydrogen bromide (HBr). Although the angle between the upper and side surfaces of each amorphous silicon film 13 is acute at the upper end 13a at the fabrication stage as shown in FIGS. 13A and 13B, the upper portions of the amorphous silicon films 13 are etched such that the upper ends 13a are formed into curved surfaces extending gently toward the upper surface (core material) side of the silicon oxide film 11. Accordingly, when the etching process is applied to the amorphous silicon films 13, the upper ends 13a are processed so that the acute shape is changed into an upwardly convexly curved shape. As a result, the amorphous silicon films 13 are formed into such a curved shape that the whole upper surfaces 13b are upwardly convex.

When focused on at this stage of fabrication, one of the amorphous silicon films 13 is formed so that an uppermost end 13bb of the upper surface 13b thereof is located substantially in the Y direction middle of the upper surface 13b. Meanwhile, reference symbol "W8" designates a distance between the uppermost ends 13bb of the adjacent amorphous silicon films 13, and reference symbol "W9" designates a distance between the uppermost ends 13bb of the amorphous silicon films 13 located with the silicon oxide film 11 being interposed therebetween. The difference between the distances W8 and W9 is smaller than the aforementioned difference between the widths W6 and W7. Thus, the opening widths between the amorphous silicon films 13 can be set to substantially the same pitch by adjusting the locations of the uppermost ends 13bb.

The silicon oxide films 11 are formed as core materials so as to remain between the amorphous silicon films 13 at this stage of fabrication. When it is assumed that the entire silicon oxide film 11 has been removed at the stage as shown in FIGS. 14A and 14B, both side surfaces of the amorphous silicon films 13 are exposed to the etching process when the upper portions of the amorphous silicon films 13 are thereafter etched. This results in less controllability for the film thickness between both side surfaces of the amorphous silicon film 13.

When the film thicknesses between both side surfaces of the amorphous silicon films 13 differ from one another, working widths and working depths of the silicon nitride films 10 also differ from one another. Accordingly, in order that the film thicknesses of both side surfaces of the amorphous silicon films 13 may be controlled more precisely, it is better to process the silicon oxide films 11 at the fabrication stage as shown in FIGS. 14A and 14b so that the silicon oxide films 11 are located higher than the upper surface of the silicon nitride film 10 and lower than the upper ends 13a of the amorphous silicon films 13. For this purpose, it is better to adjust an etching time in dry-etching the silicon oxide films 11 so that the upper ends 13a of the amorphous silicon films 13 are exposed to such a degree that the upper ends 13a become etchable.

Consequently, the side surfaces of the amorphous silicon film 13 contacting with the silicon oxide films 11 are substantially prevented from being exposed to the etching process, and accordingly, the film thickness of only exposed one of the sides of each amorphous silicon film 13 is controlled. In this case, another etching process is also applied to the exposed side surfaces of each amorphous silicon film 13 when each amorphous silicon film 13 is caused to remain in the spacer shape along the side surface. Accordingly, the etching conditions are set so that a proper side surface location is obtained when the etching processes to be executed for the amorphous silicon films 13 before and after removal of the upper portions are accommodated with each other. As a result, the film thicknesses between the side surfaces of each amorphous silicon film 13 can easily be controlled with high precision in this case. Furthermore, when each amorphous silicon film 13 has a larger height, a certain strength can be ensured since the silicon oxide films 11 are formed along the side surfaces of the amorphous silicon films 13, whereupon the reliability during the etching process can be improved.

The dry etching processes by the RIE method as shown in FIGS. 13A to 15B can be sped up when executed sequentially continuously (multistep process). In this case, the dry etching processes are executed under the conditions changed regarding an atmosphere to be used in the same etching chamber, for example, a gas to be used.

Figure 17B:
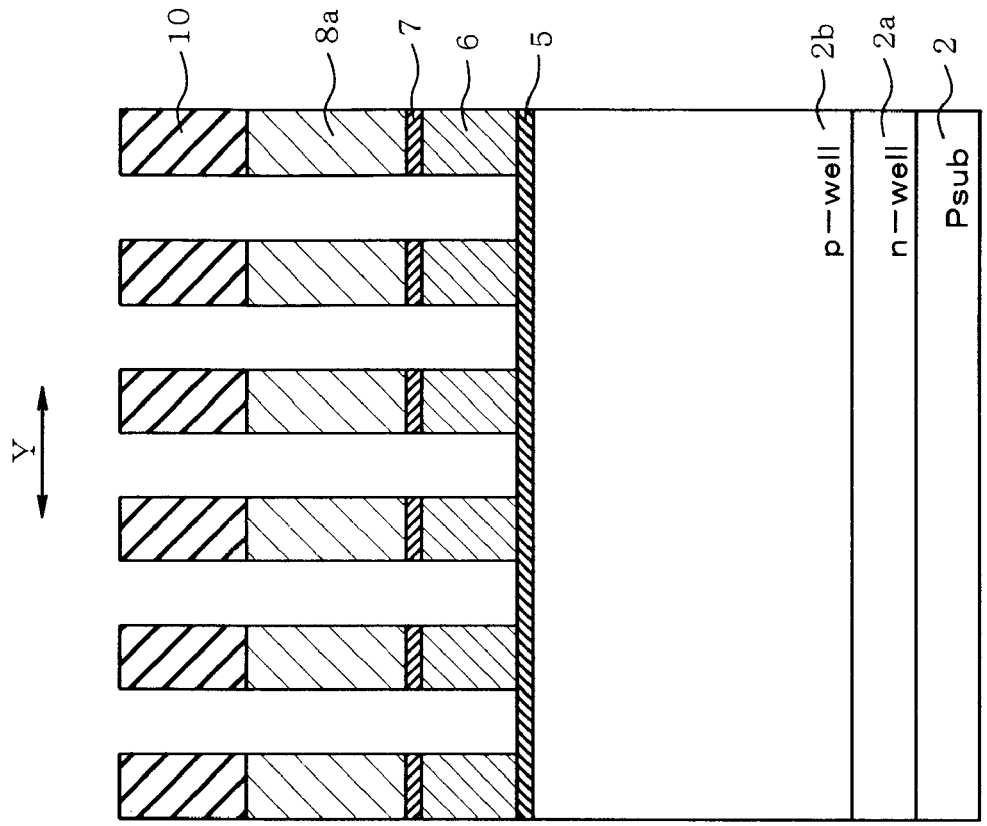
Figure 17A:
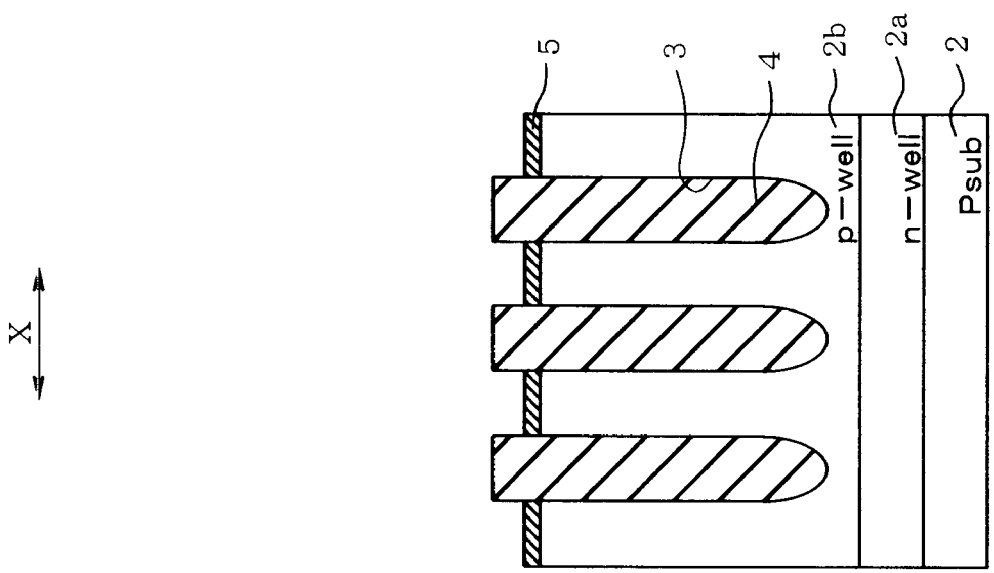

Subsequently, the silicon oxide film 11 is removed as shown in FIGS. 16A and 16B. In this case, it is better to apply a wet etching process or the like as the removing method. Subsequently, the silicon nitride films 10, the silicon layers 8a, the intergate insulating films 7 and the polycrystalline silicon layers 6 are etched as shown in FIGS. 17A and 17B. In this case, it is better to divide these films and layers 10, 8a, 7 and 6, for example, by a dry etching process (for example, anisotropic etching by the RIE method).

Subsequently, in order that the source/drain regions 2c may be formed, n-type impurities are ion-implanted and a thermal treatment is carried out for the purpose of activation of the impurities, as shown in FIG. 3B. In FIG. 3B, the polycrystalline silicon layers 6, intergate insulating films 7 and silicon layer 8a are configured into a stacked structure. Thereafter, dividing regions of the stacked structure are filled with interlayer insulating films 9 respectively. Upper portions of the silicon layers 8a are silicided by a metal such that the conductive layers 8 are formed.

According to the foregoing embodiment, the pattern of divided silicon oxide films 11 is formed on the silicon nitride film 10, and the amorphous silicon films 13 are formed on the sidewalls of the silicon oxide films 11 into the spacer-shape. Thereafter, the silicon oxide films 11 are partially etched under the condition that the silicon oxide films 11 have a higher selectivity than the amorphous silicon films 13, whereby the silicon oxide films 11 are processed so that the upper ends 11a of the silicon oxide films 11 are located lower than the upper ends 13a of the amorphous silicon films 13 and higher than the upper surface of the silicon nitride film 10. The upper portions (the upper ends 13a, particularly) of the amorphous silicon films 13 are then etched under the condition that the amorphous silicon films 13 have a higher selectivity than the silicon nitride film 10. The silicon oxide films 11 are then removed, and the silicon nitride film 10 and the stacked structure of the layers and films 6 to 8 located under the film 10 are etched with the amorphous silicon films 13 serving as masks.

Accordingly, the amorphous silicon films 13 serve as the masks when the stacked structure located under the silicon nitride film 10 is etched. The amorphous silicon films 13 have the respective upper surfaces 13b which are each formed into such a curved shape that the central portions of the amorphous silicon films 13 are upwardly convex and that the Y direction ends of the amorphous silicon films 13 are curved gently downward. As the result, the Y-directional symmetric property of the amorphous silicon films 13 can be improved.

Consequently, the opening widths between the upper ends 13bb of the upper surfaces 13b of the amorphous silicon films 13 can become substantially the same at both Y direction sides of the amorphous silicon films 13. As a result, the silicon nitride films 10 located at both sides of the amorphous silicon films 13 can be etched uniformly. Accordingly, when a sidewall transfer process is applied to the forming of a pattern, the working widths at both sides of the mask (the amorphous silicon film 13) can be maintained substantially at a constant value. Furthermore, the working depth of the area under the silicon nitride film 10 can also be maintained substantially at a constant value by adjustment of an etching time, whereupon a machining profile difference can be rendered substantially constant. Consequently, a yield ratio of the devices can be improved.

The dry etching processes are executed sequentially regarding the fabrication steps as shown in FIG. 13A to FIG.

15B. As a result, since no wet etching process needs to be executed, for example, the processing can be expedited. Furthermore, the same etching chamber can be used when the dry etching processes by the RIE method are executed sequentially continuously (multistep process) with the etching conditions being changed. Additionally, since the silicon oxide films 11 are removed by the wet etching process, the films 11 can be prevented from remaining between the adjacent amorphous silicon films 13.

FIGS. 18A to 21B illustrate a second embodiment. The second embodiment differs from the foregoing embodiment in that a film stack of an organic film and an inorganic film is applied to the first film. Identical or similar parts in the second embodiment are labeled by the same reference symbols as those used in the first embodiment, and the detailed description of these parts will be eliminated. Only the differences will be described in the following.

Regarding FIGS. 18A to 21B, figures with the numbers to which suffixes "A" are attached schematically show the longitudinal sections taken along line 17A-17A in FIG. 2 in one fabrication step, and figures with the numbers to which suffixes "B" are attached schematically show the longitudinal sections taken along line 3B-3B in FIG. 2 at the fabrication step.

Figure 18A:
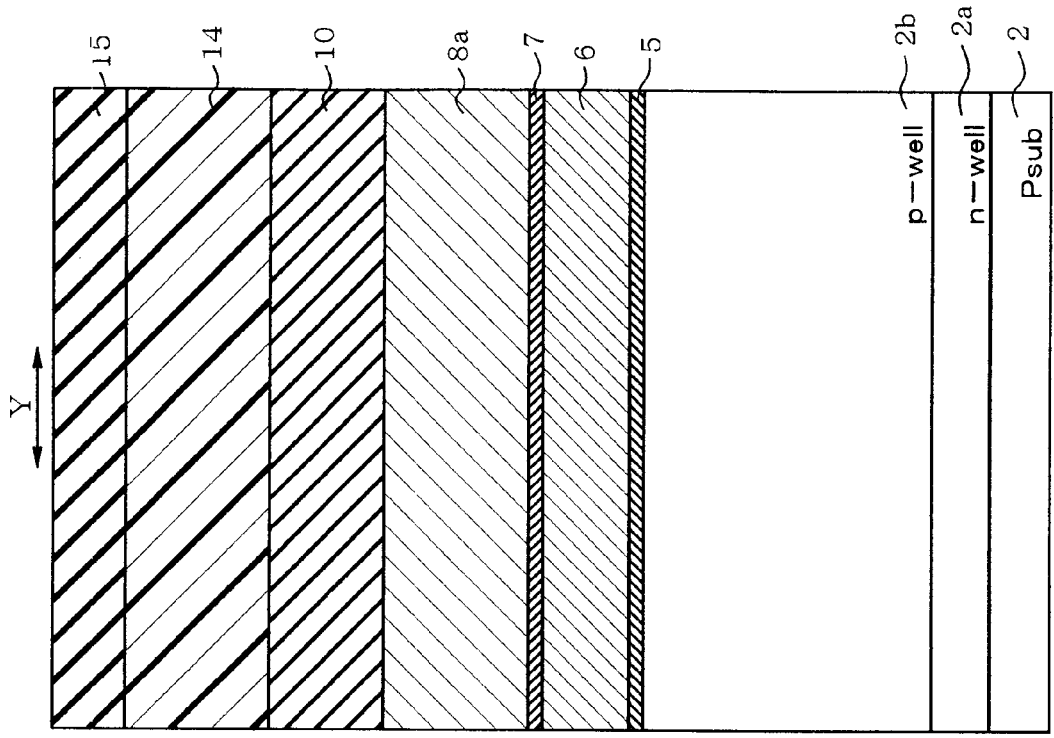
Figure 18B:
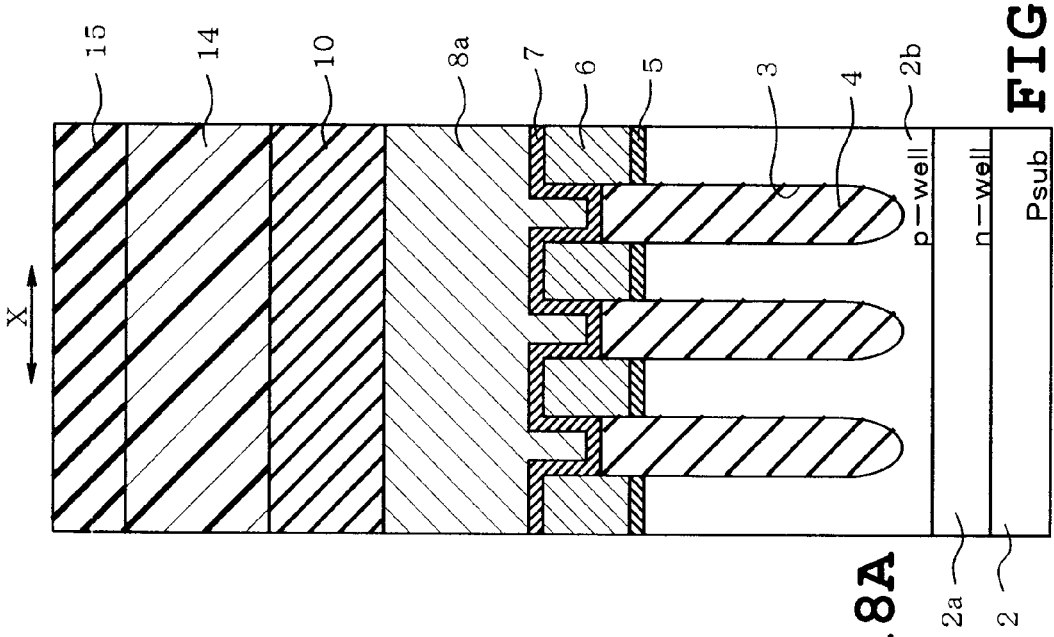

A carbon film 14 is formed on the silicon nitride film 10 by the CVD method, and a coating type silicon oxide film (spin-on glass (SOG) film) 15 as an inorganic film is formed on the carbon film 14, as shown in FIGS. 18A and 18B.

Figure 19A:
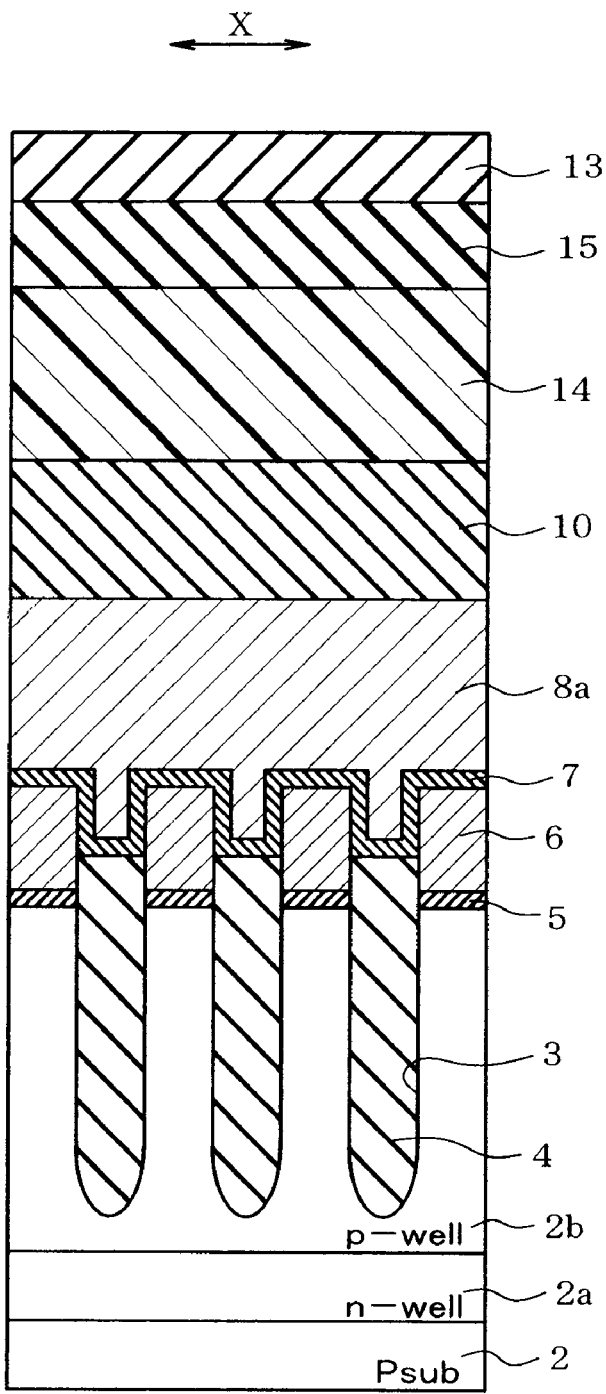
Figure 19B:
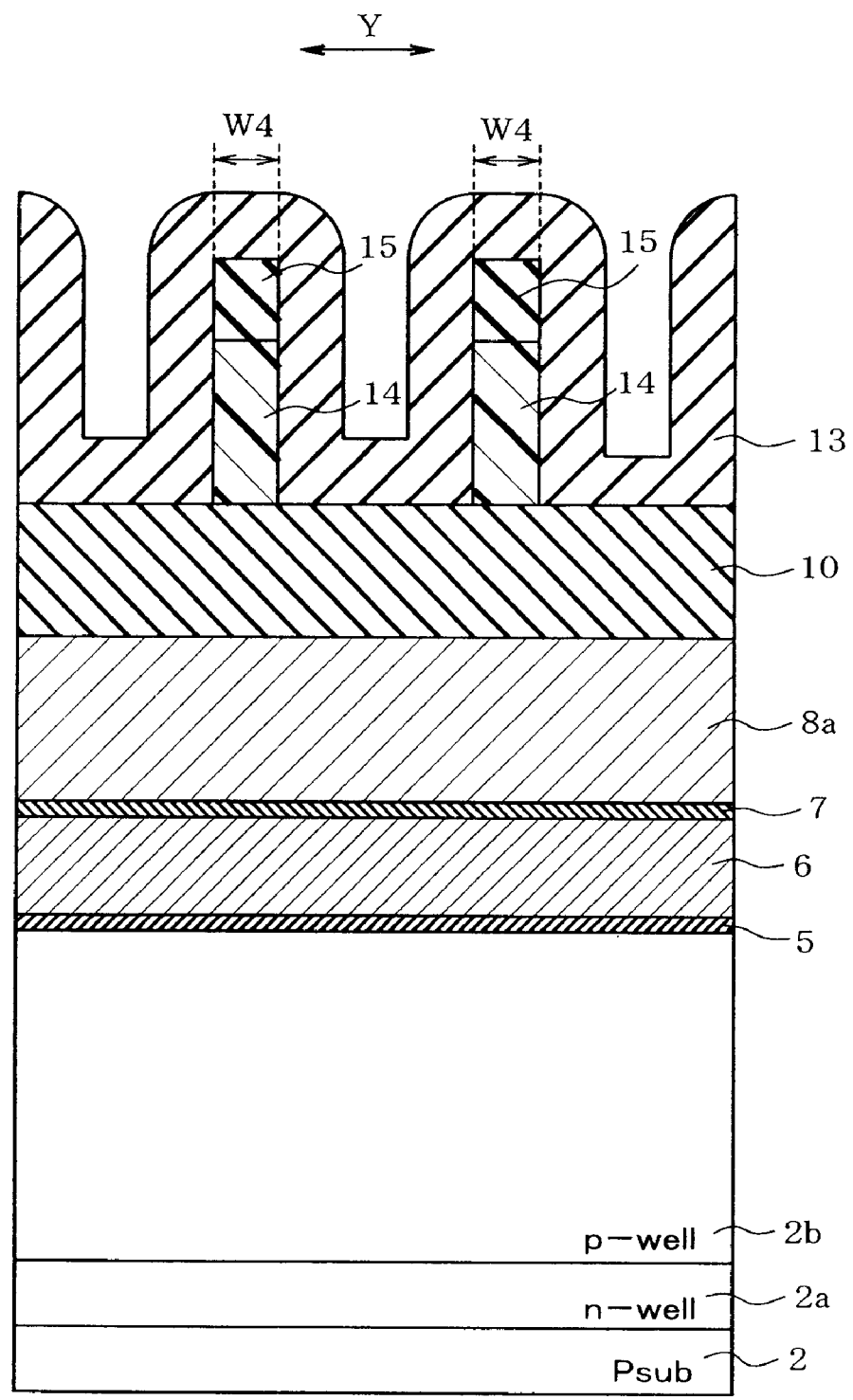

Subsequently, a photoresist (not shown) is stacked as a mask using a spin coat technique and then patterned using an exposure technique. Subsequently, the silicon oxide film 15 is etched with the patterned photoresist serving as a mask, and thereafter, the carbon film 14 is etched together with the remaining photoresist, whereupon an upper surface of the silicon nitride film 10 is exposed. Subsequently, the carbon film 14 and the silicon oxide film 15 are thinned using a slimming technique, and the exposed upper surface of the silicon nitride film 10 is enlarged. The amorphous silicon film 13 is then formed in the same manner as in the foregoing embodiment as shown in FIGS. 19A and 19B. Consequently, the amorphous silicon film 13 is formed along the upper surfaces of the silicon oxide films 15, side surfaces of the silicon oxide films 15 and the carbon films 14, and the exposed upper surface of the silicon nitride film 10.

Figure 20A:
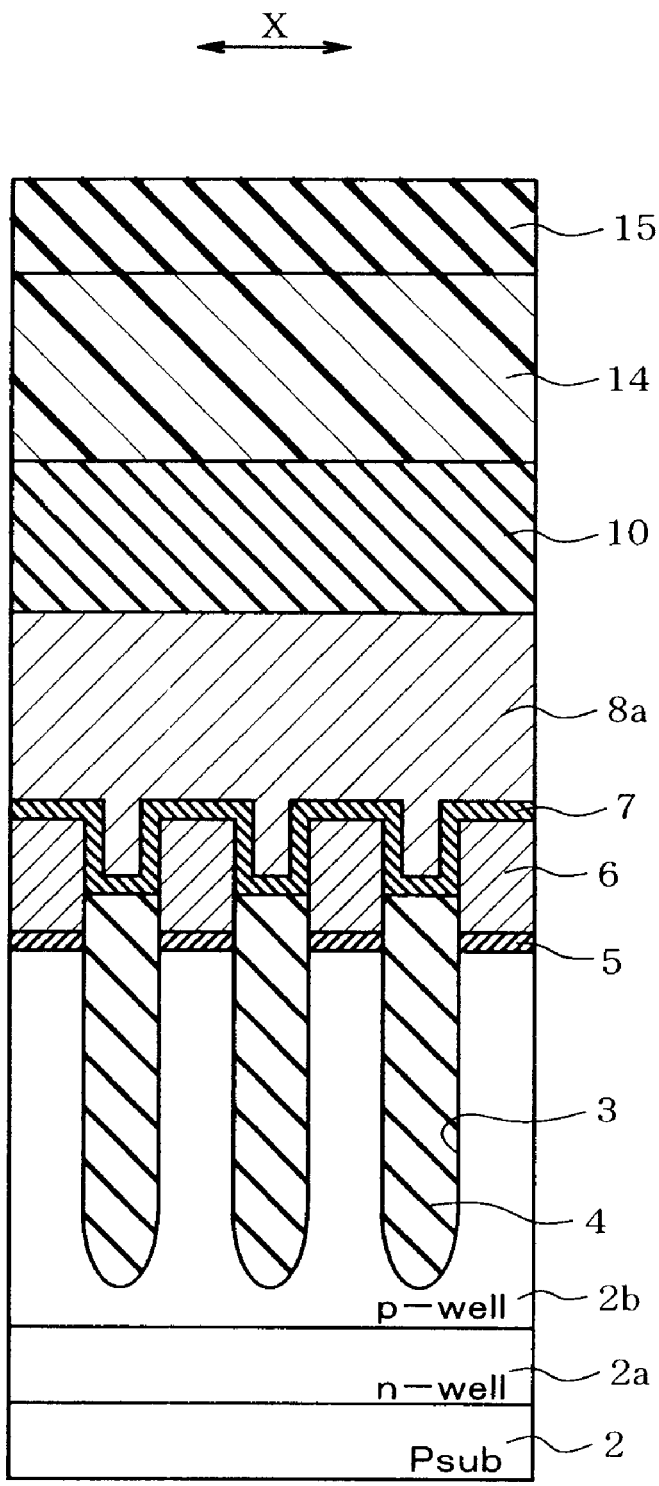
Figure 20B:
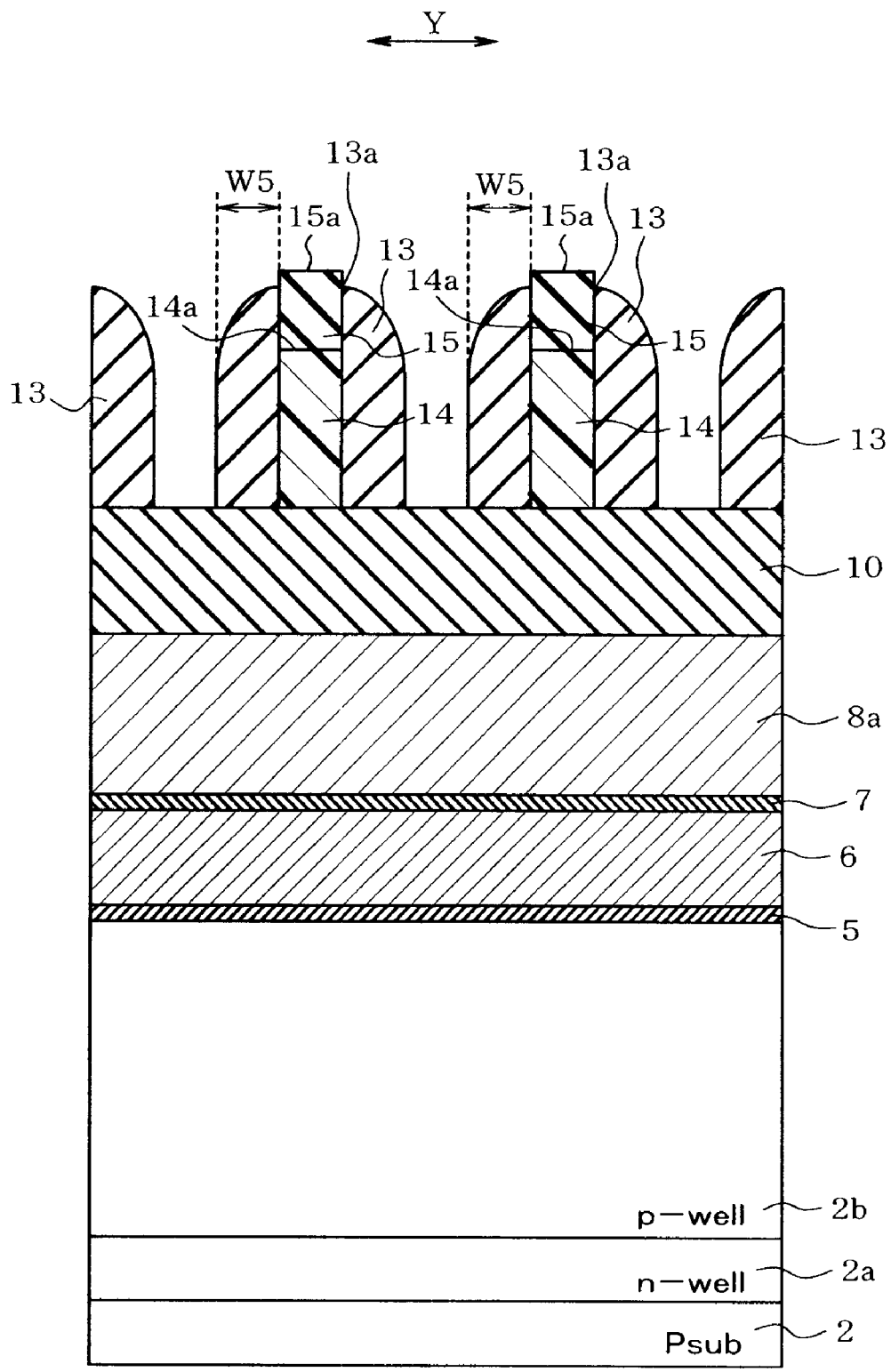

Subsequently, the amorphous silicon films 13 are dry-etched so that the upper surfaces of the silicon oxide films 15 are exposed, as shown in FIGS. 20A and 20B. Furthermore, an opening is formed substantially in the middle between a stacked structure of the carbon film 14 and the silicon oxide film 15 and an adjacent structure, whereby the upper surface of the silicon nitride film 10 is exposed. The dry etching process is carried out using a gas including chlorine gas ($Cl_2$) and hydrogen bromide (HBr), or the like. Since the dry etching process is executed without use of fluorocarbon gas, the amorphous silicon film 13 can be processed while having a higher selectivity than the silicon nitride film 10. In this case, the amorphous silicon film 13 is formed so that the upper end (upper surface) 13a thereof is located lower than the upper ends (upper surfaces) 15a of the silicon oxide films 15 and higher than the upper surfaces 14a of the carbon films 14.

Subsequently, only the silicon oxide films 15 are removed by the wet etching process, for example, so that the upper surfaces 14a of the carbon films 14 are exposed. In this case, an etching depth is set so that the upper surfaces 14a of the carbon films 14 are located lower than the upper ends 13a of the amorphous silicon films 13 and higher than the upper surface of the silicon nitride film 10. When the silicon oxide films 15 are processed under the condition that the silicon oxide films 15 have a higher selectivity than the carbon films 14, the amorphous silicon films 13 and the silicon nitride film 10, heightwise locations of the upper surfaces 14a of the carbon films 14 become easy to adjust. Subsequently, the upper ends 13a of the amorphous silicon films 13 are etched under the condition that the upper ends 13a have a higher selectivity than the silicon nitride film 10, in the same manner as in the foregoing embodiment, and thereafter, the carbon films 14 are removed. In this case, when the carbon core material is used, an ashing process is executed under the condition that the carbon film 14 has a higher selectivity than the amorphous silicon films 13 and the silicon nitride film 10, whereupon the carbon films 14 can be removed. An ashing gas usable in this case includes oxygen ($O_2$) gas, nitride ($N_2$) gas, hydrogen ($H_2$) gas and ammonia ($NH_3$) gas. Subsequent steps are substantially the same as those in the foregoing embodiment, and the description of the subsequent steps will be eliminated.

According to the second embodiment, the stacked structure of the carbon film 14 and the silicon oxide film 15 is used instead of the silicon oxide film 11. Consequently, the second embodiment can achieve substantially the same working effect as the foregoing embodiment. Furthermore, since the silicon oxide films 15 can be removed under the condition that the silicon oxide films 15 have the higher selectivity than the carbon films 14, the locations of the upper surfaces 14a can be adjusted without adjustment of an etching time, whereupon the location adjustment of the upper surfaces 14a can be rendered easier.

Figure 22:
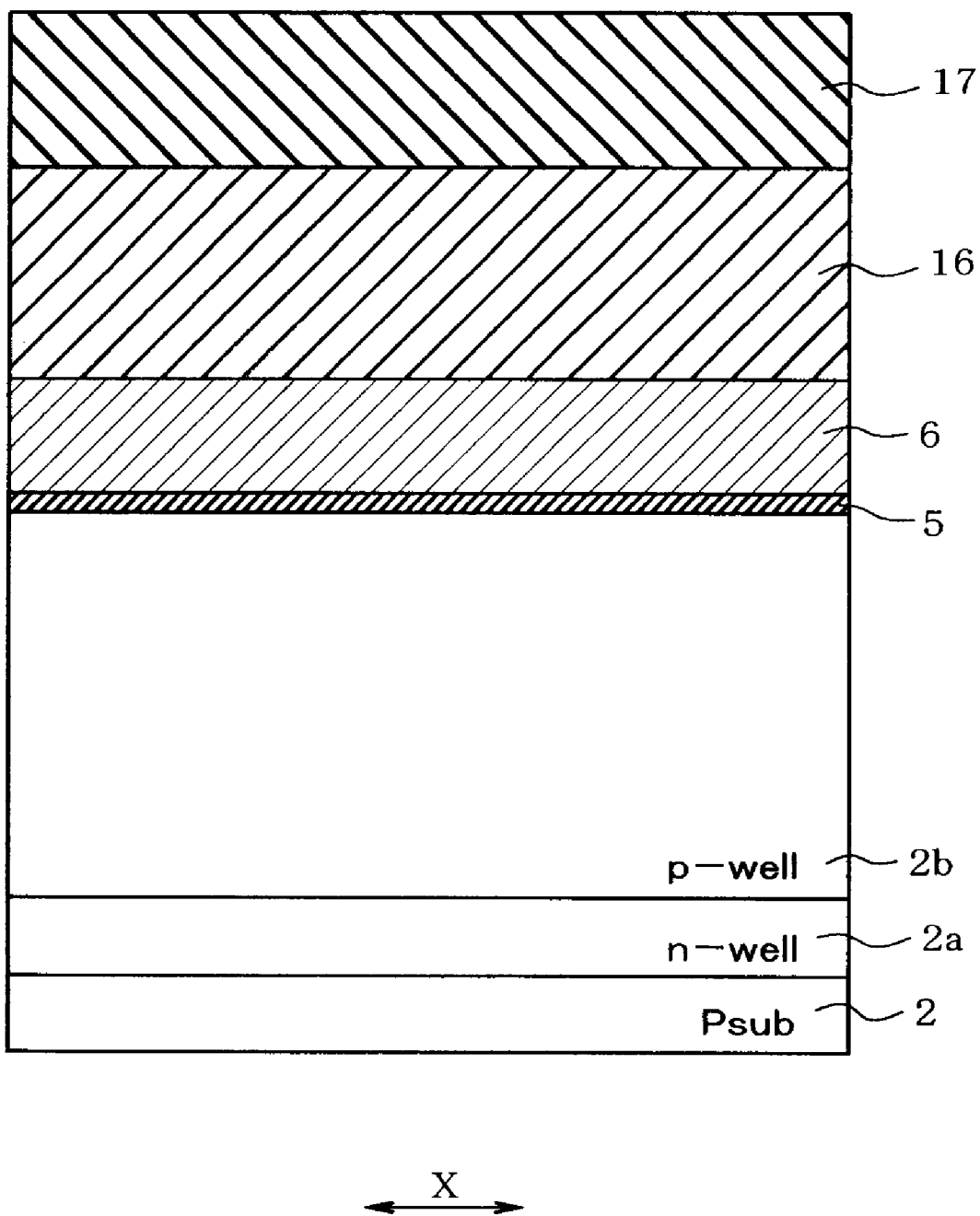
FIGS. 22 to 24 are schematic longitudinal sections taken along line 17A-17A in FIG. 2, showing steps of the fabrication method of a third embodiment respectively.
Figure 23:
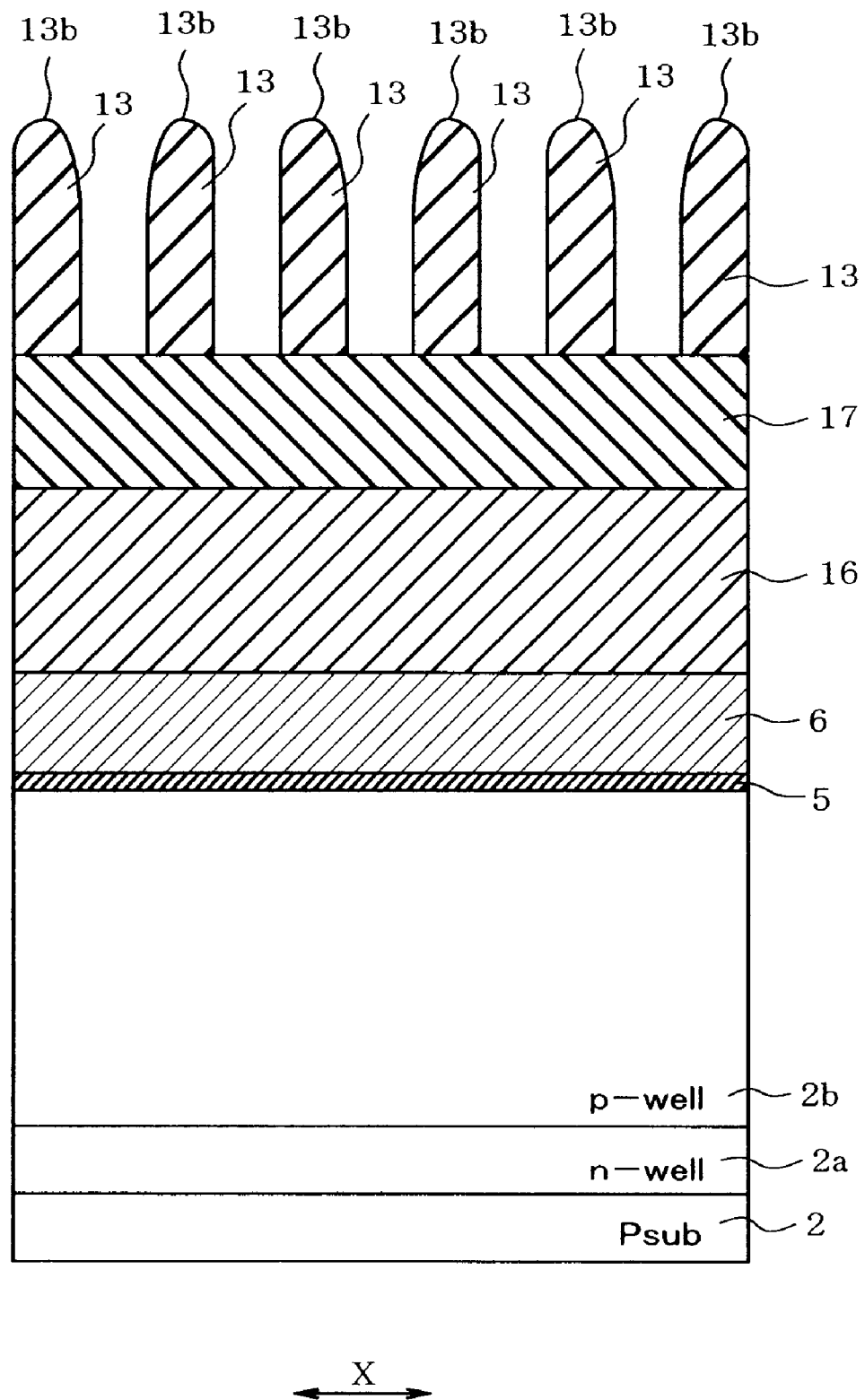
Figure 24:
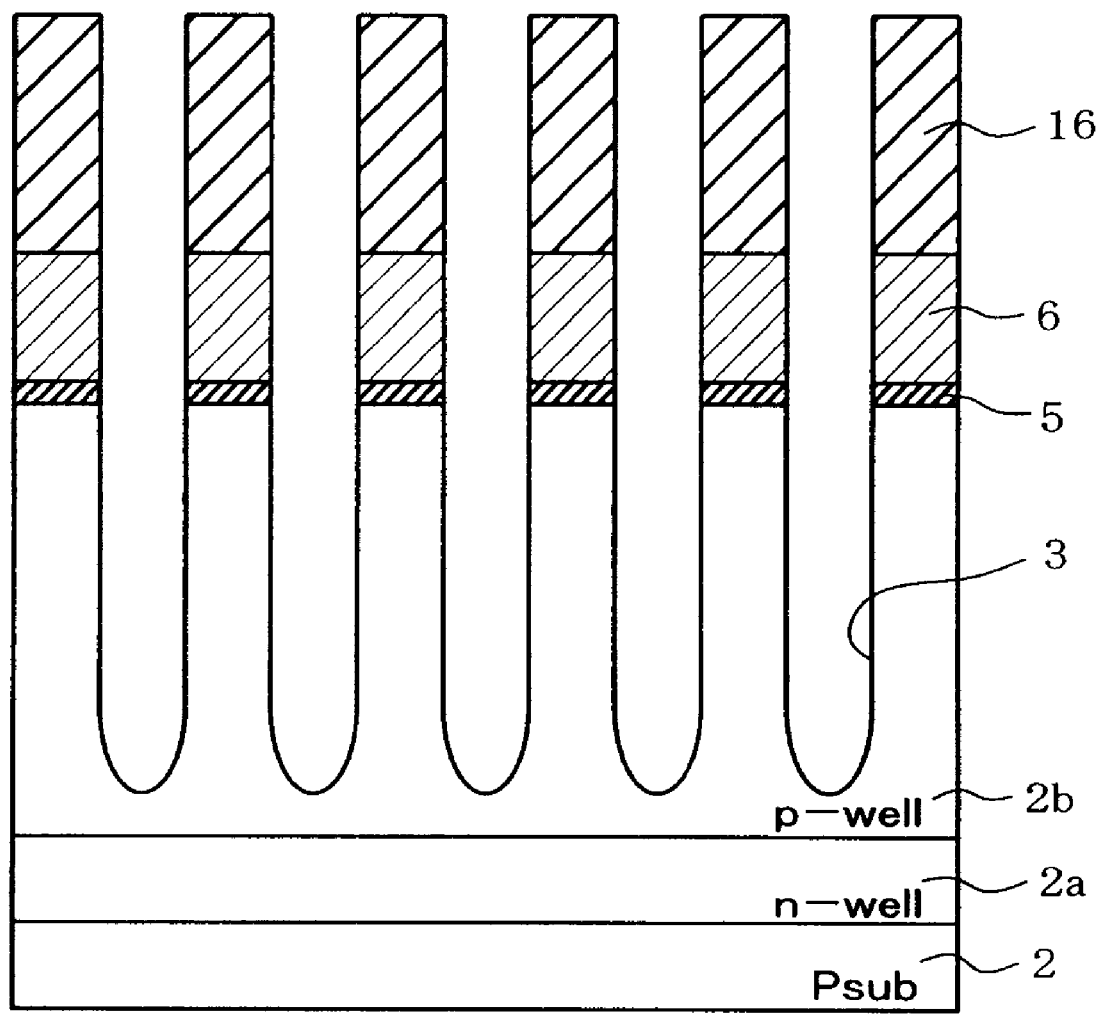

FIGS. 22 to 24 illustrate a third embodiment. The third embodiment differs from the foregoing embodiments in that the third embodiment is applied to a case where element isolation trenches are formed. Identical or similar parts in the third embodiment are labeled by the same reference symbols as those used in the foregoing embodiments, and the detailed description of these parts will be eliminated. Only the differences will be described in the following.

FIGS. 22 to 24 stepwisely show the fabrication process up to the forming of element isolation trenches 3. The gate insulating film 5 is formed on the semiconductor substrate 2 as shown in FIG. 4, and the polycrystalline silicon film 6 is formed on the gate insulating film 5 as shown in FIG. 5. Subsequently, a silicon nitride film 16 is deposited on the polycrystalline silicon film 6 by the CVD method, and a silicon oxide film 17 is further deposited on the silicon nitride film 16.

Subsequently, the amorphous silicon films 13 are formed on the silicon oxide film 17 as a mask via the sidewall transfer process as described in the first embodiment, as shown in FIG. 23. Subsequently, the films 17, 16, 6 and 5, and an upper part of the semiconductor substrate 2 are anisotropically etched sequentially with the amorphous silicon films 13 serving as masks as shown in FIG. 24, whereby the element isolation trenches 3 are formed. Since subsequent steps have little bearing on the embodiment, the description of the subsequent steps will be eliminated.

According to the third embodiment, the microstructurization in the X direction can be achieved since the fabrication method is applied to the forming of the element isolation trenches 3.

The foregoing embodiments are not restrictive and can be modified or expanded as follows. Although the foregoing embodiments are applied to the flash memory 1, any other semiconductor device necessitating the microstructurization may be embodied. Furthermore, although the foregoing embodiments are directed to the respective forms of fabrication process, one or more embodiments may be directed to a step of forming trenches in an interlayer insulating film or a step of forming bit lines.

Although the p-type silicon substrate formed with the wells 2a and 2b is applied to the semiconductor substrate 2 in the foregoing embodiments, a n-type silicon substrate having a surface layer formed with p-wells may be employed, instead. Furthermore, the X and Y directions may be perpendicular to each other in the upper surface of the semiconductor substrate 2.

In the first embodiment, the silicon nitride film 10 is employed as a processed film, the silicon oxide film 11 is employed as the first film, and the amorphous silicon film 13 is employed as the second film. However, these films may be changed among them, instead. Furthermore, although the amorphous silicon film 13 is employed as the silicon film, a polycrystalline silicon film may be employed as the silicon film, instead of the amorphous silicon film 13.

Furthermore, the processed film, the first film serving as the core material and the second film serving as the sidewall spacers may each be any film only if a proper etch selectivity is obtainable among the films. It is better to employ, as the processed film and first and second films, respective any films different from one another, such as a silicon film, silicon oxide film, silicon nitride film and organic film (resist or carbon film, for example). Additionally, the silicon oxide film may comprise a tetraethoxysilane (TEOS) film, a borophosphosilicate glass (BPSG) film, a boro-silicate glass (BSG) film, a phosphor-silicate glass (PSG) film or a fluorine-doped silicate glass (FSG) film.

The expression "correspond with" in the foregoing description is used as including fabrication error and/or fabrication tolerance without affecting characteristics.

The foregoing embodiments are directed to the process of fabricating the gate electrodes MG and the process of fabricating the element isolation trenches 3. One or more embodiments may be applied to another applicable fabrication process, and the above-described sidewall transfer process may be applied to a plurality of fabrication processes, instead.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A method of fabricating a semiconductor device, comprising:
    forming a first film on a processed film;
    patterning the first film into a pattern with a smaller width and a space with a larger width, thereby exposing an upper surface of the processed film;
    forming a second film along an upper surface and side surface of the first film and the upper surface of the processed film;
    etching the second film under a condition that the second film has a higher etch selectivity than the first film, thereby exposing the upper surfaces of the first film and the processed film while part of the second film remains along the side surface of the first film;
    etching the first film under a condition that the first film has a higher etch selectivity than the second film, so that an upper end of the first film is located lower than an upper end of the second film and so that the upper end of the first film is located higher than the processed film;
    etching an upper part of the second film under a condition that the upper part of the second film has a higher etch selectivity than the processed film, after the first film has been etched;
    removing the first film after the upper part of the second film has been etched; and
    etching the processed film with the second film serving as a mask after the first film has been removed.

2. The method according to claim 1, wherein a silicon film, a silicon oxide film, a silicon nitride film and an organic material film are applied to the processed film and the first and second films.

3. The method according to claim 2, wherein an amorphous silicon film or a polycrystalline silicon film is applied to the silicon film.

4. The method according to claim 2, wherein anyone of films of tetraethoxysilane (TEOS), borophosphosilicate glass (BPSG), boro-silicate glass (BSG), phosphor-silicate glass (PSG) and fluorine-doped silicate glass (FSG) is applied to the silicon oxide film.

5. The method according to claim 2, wherein a resist or a carbon film is applied to the organic material film.

6. The method according to claim 1, wherein an amorphous silicon film is applied to the second film, and in etching the upper part of the second film, the upper part of the second film is dry-etched using a halogen gas containing chloride ($Cl_2$) or hydrogen bromide (HBr).

7. The method according to claim 1, wherein a silicon oxide film is applied to the first film, and in etching the first film, the first film is dry-etched using a fluorocarbon gas.

8. The method according to claim 1, wherein dry-etching processes are executed in etching the second film, first film and the upper part of the second film sequentially respectively.

9. The method according to claim 1, wherein the etching of the second and first films and the upper part of the second film is continuously executed by a reactive ion etching (RIE) method with an etching condition being changed.

10. The method according to claim 1, wherein in removing the first film, the first film is removed by a wet etching process.

11. The method according to claim 1, wherein:
    in forming the first film, a stacked structure film of lower and upper layer films either one of which has a higher etch selectivity than the other are applied to the first film;
    in etching the first film, the upper layer film is removed under a condition that the upper layer film has a higher etch selectivity than the lower layer film so that an upper end of the lower layer film is located lower than the upper end of the second film and so that the upper end of the lower layer film is located higher than the upper surface of the processed film; and
    in removing the first film, the lower layer film is removed after the upper part of the second film has been etched.

12. The method according to claim 11, wherein an organic material film and an inorganic material film are applied to the lower and upper layer films respectively.

13. The method according to claim 11, wherein a carbon film is applied to the lower layer film, and in removing the lower layer film, the lower layer film is ashed under a condition that the lower layer film has a higher etch selectivity than the second film and the processed film.

14. The method according to claim 13, wherein in removing the lower layer film, any one of oxygen ($O_2$) gas, nitrogen ($N_2$) gas, hydrogen ($H_2$) gas or ammonia ($NH_3$) gas is used in ashing the lower layer film.

15. The method according to claim 11, wherein in etching the first film, a wet etching process is executed to remove the upper layer film.

16. The method according to claim 12, wherein an SOG film is applied to the upper layer film.

17. The method according to claim 1, further comprising:
   forming a gate insulating film on a semiconductor substrate before forming the first film;
   forming a floating gate electrode film on the gate insulating film before forming the first film; and
   forming the processed film above the floating gate electrode film before forming the first film,
   wherein after the processed film has been etched, an obtained pattern of the processed film is transferred to the floating gate electrode film, the gate insulating film and a surface layer of the semiconductor substrate, thereby forming an element isolation trench.

18. The method according to claim 17, wherein a silicon layer is applied to the floating gate electrode film.

19. The method according to claim 1, further comprising:
   forming a gate insulating film on a semiconductor substrate before forming the first film;
   forming a floating gate electrode film on the gate insulating film before forming the first film;
   forming an element isolation trench in the floating gate electrode, the gate insulating film and a surface layer of the semiconductor substrate along a first direction before forming the first film;
   filling the element isolation trench with an element isolation insulating film before forming the first film;
   forming an intergate insulating film on the floating gate electrode film and the element isolation insulating film before forming the first film;
   forming a conductive layer on the intergate insulating film before forming the first film; and
   forming the processed film above the conductive layer before forming the first film, wherein:
   in etching the processed film, the processed film is etched thereby to be processed along a second direction perpendicular to the first direction; and
   a pattern of the processed film is transferred to the conductive layer, the intergate insulating film and the floating gate electrode film, thereby forming a stacked gate structure along the second direction.

20. The method according to claim 19, wherein a silicon layer is applied to the conductive layer, and a silicon nitride film is applied to the processed film.

* * * * *